(12) United States Patent
Sherman et al.

(10) Patent No.: US 9,847,205 B2
(45) Date of Patent: Dec. 19, 2017

(54) HIGH RELIABILITY, LONG LIFETIME, NEGATIVE ION SOURCE

(71) Applicant: Phoenix Nuclear Labs LLC, Monona, WI (US)

(72) Inventors: Joseph D. Sherman, Santa Fe, NM (US); Evan R. Sengbusch, Verona, WI (US); Ross F. Radel, Madison, WI (US); Arne V. Kobernik, Madison, WI (US); Tye T. Gribb, Fitchburg, WI (US); Preston J. Barrows, Madison, WI (US); Christopher M. Seyfert, Ridgeway, WI (US); Logan D. Campbell, Madison, WI (US); Daniel J. Swanson, Madison, WI (US); Eric D. Risley, Middleton, WI (US); Jin W. Lee, Madison, WI (US); Kevin D. Meaney, Green Bay, WI (US)

(73) Assignee: PHOENIX LLC, Monona, WI (US)

( * ) Notice: Subject to any disclaimer, the term of this patent is extended or adjusted under 35 U.S.C. 154(b) by 0 days.

(21) Appl. No.: 14/903,747

(22) PCT Filed: Jun. 26, 2014

(86) PCT No.: PCT/US2014/044382
§ 371 (c)(1),
(2) Date: Jan. 8, 2016

(87) PCT Pub. No.: WO2015/006065
PCT Pub. Date: Jan. 15, 2015

(65) Prior Publication Data
US 2016/0163495 A1   Jun. 9, 2016

Related U.S. Application Data

(60) Provisional application No. 61/844,054, filed on Jul. 9, 2013.

(51) Int. Cl.
*H01J 27/02*  (2006.01)
*H01J 37/08*  (2006.01)
(Continued)

(52) U.S. Cl.
CPC .......... *H01J 27/028* (2013.01); *H01J 27/024* (2013.01); *H01J 27/16* (2013.01); *H01J 27/18* (2013.01); *H01J 27/22* (2013.01); *H01J 37/08* (2013.01)

(58) Field of Classification Search
CPC .......... H01J 27/028; H01J 27/16; H01J 27/22; H05H 1/46; H05H 3/02; H05H 1/0006
(Continued)

(56) References Cited

U.S. PATENT DOCUMENTS

| 4,559,477 A | 12/1985 | Leung et al. | |
| 5,438,194 A * | 8/1995 | Koudijs | .............. H01J 49/0086 250/282 |

(Continued)

FOREIGN PATENT DOCUMENTS

| JP | 58-094741 | 6/1983 |
| JP | 62-126537 | 6/1987 |

(Continued)

OTHER PUBLICATIONS

Lee, B. S. et al., Surface Production of H-Ions by Hyperthermal Hydrogen Atoms, Applied Physics Letters, A I P Publishing LLC, US, vol. 61, No. 24, Dec. 14, 1992, pp. 2857-2859.
(Continued)

*Primary Examiner* — Douglas W Owens
*Assistant Examiner* — Syed M Kaiser
(74) *Attorney, Agent, or Firm* — David A. Casimir; Casimir Jones, S.C.

(57) ABSTRACT

A negative ion source includes a plasma chamber, a microwave source, a negative ion converter, a magnetic filter and
(Continued)

a beam formation mechanism. The plasma chamber contains gas to be ionized. The microwave source transmits microwaves to the plasma chamber to ionize the gas into atomic species including hyperthermal neutral atoms. The negative ion converter converts the hyperthermal neutral atoms to negative ions. The magnetic filter reduces a temperature of electrons provided between the plasma chamber and the negative ion converter. The beam formation mechanism extracts the negative ions.

20 Claims, 24 Drawing Sheets

(51) Int. Cl.
  *H01J 27/18* (2006.01)
  *H01J 27/16* (2006.01)
  *H01J 27/22* (2006.01)
(58) Field of Classification Search
  USPC .......... 250/423 R, 427, 424, 423 F, 426, 489
  See application file for complete search history.

(56) References Cited

U.S. PATENT DOCUMENTS

| | | | |
|---|---|---|---|
| 5,581,156 A * | 12/1996 | Roberts | H01J 27/18 250/423 F |
| 6,217,703 B1 | 4/2001 | Kitagawa | |
| 6,335,535 B1 * | 1/2002 | Miyake | H01J 37/32412 250/423 R |
| 2001/0008805 A1 | 7/2001 | Kitagawa | |
| 2004/0104683 A1 * | 6/2004 | Leung | H01J 27/18 315/111.81 |
| 2004/0119006 A1 * | 6/2004 | Samukawa | H05H 3/02 250/251 |
| 2007/0069118 A1 | 3/2007 | Economou et al. | |
| 2009/0084501 A1 | 4/2009 | Chen et al. | |
| 2009/0314952 A1 * | 12/2009 | Peters | H01J 27/028 250/423 R |
| 2015/0245461 A1 * | 8/2015 | Belchenko | H05H 3/02 250/251 |

FOREIGN PATENT DOCUMENTS

| | | |
|---|---|---|
| JP | 07-262945 | 10/1995 |
| JP | 08-082689 | 3/1996 |
| JP | 2000-100790 | 4/2000 |
| JP | 2005-116312 | 4/2005 |
| JP | 2007-096256 | 4/2007 |
| JP | 2012-519143 | 8/2012 |
| RU | 2368977 C2 | 9/2009 |

OTHER PUBLICATIONS

Notification of Reason for Refusal for Korean Application No. 10-2016-7003453, dated Feb. 9, 2017, 15 pages (with machine translation).
Extended European Search Report for European Patent Application No. 14823289.5, dated Jan. 13, 2017, 9 pages.
Official Action for Japanese Patent Application No. 2016-525376, dated Jan. 18, 2017, 14 pages (with English translation).
International Search Report and Written Opinion for Application No. PCT/US2014/044382, dated Oct. 16, 2014, 11 pages.
International Preliminary Report on Patentability for Application No. PCT/US2014/044382, dated Jan. 21, 2016, 8 pages.
Extended Search Report for European Application No. 14823289.5, dated Jan. 13, 2017, 9 pages.
Lee et al., Surface Production of H-Ions by Hyperthermal Hydrogen Atoms, Dec. 14, 1992, 3 pages.

* cited by examiner

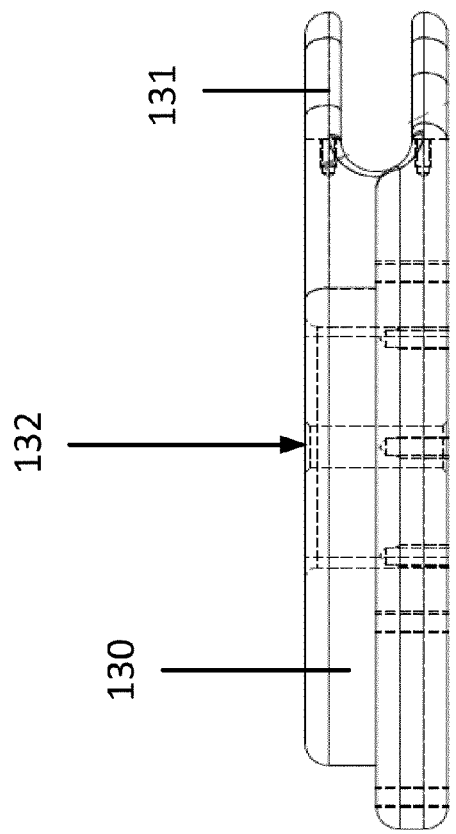
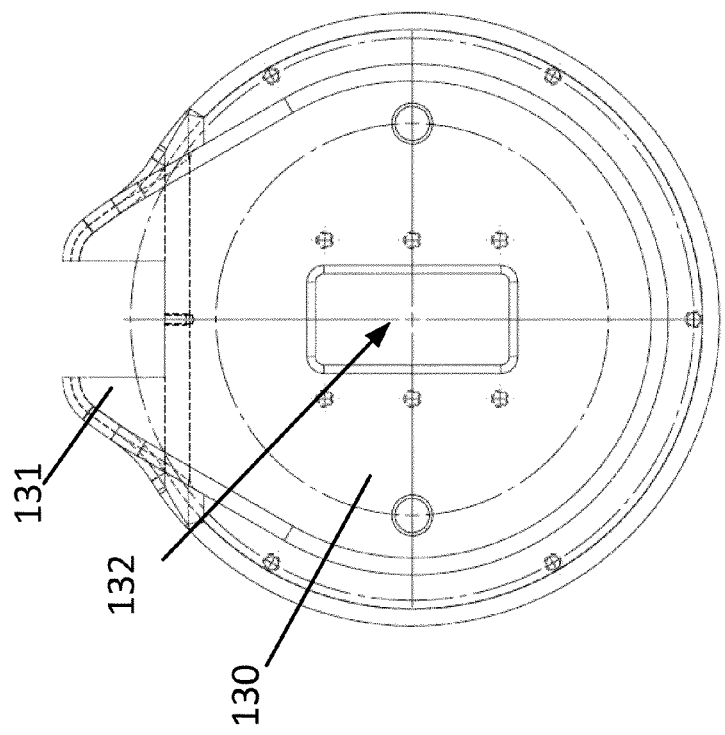
Fig. 8
Fig. 7

HIGH RELIABILITY, LONG LIFETIME, NEGATIVE ION SOURCE

CROSS REFERENCE TO RELATED APPLICATIONS

This application is a National Stage of International Application No. PCT/US2014/044382, filed Jun. 26, 2014, which claims the benefit of U.S. Provisional Application No. 61/844,054 filed on Jul. 9, 2013, which are hereby incorporated by reference in their entirety.

FIELD

The present application relates generally to the field of negative ion sources. More specifically, the present application relates to systems and methods for producing hyperthermal neutral atoms and converting them to negative ions via interaction with a cesiated conversion cone and extracting the negative ions into a high voltage (~30 kV) ion beam.

BACKGROUND INFORMATION

This section is intended to provide a background or context to the invention recited in the claims. The description herein may include concepts that could be pursued, but are not necessarily ones that have been previously conceived or pursued. Therefore, unless otherwise indicated herein, what is described in this section is not prior art to the description and claims in this application and is not admitted to be prior art by inclusion in this section.

Ion sources are used across a wide range of applications including basic science research, medical applications, and semiconductor production. In many cases, the performance and reliability of very large, complex, and expensive systems is limited by the performance and reliability of the ion source, which often represents a relatively small part of the total system in terms of size and cost. Thus, advances in ion source technologies can lead to drastic improvements in system performance relatively quickly. However, ion sources are complex devices that often suffer from reliability issues when pushed to high currents, as is often demanded by the rest of the system.

Lifetime and reliability issues are especially troublesome for existing negative ion sources, such as negative hydrogen (H−) ion sources. Nonetheless, negative ion sources are still commonly used across a broad range of applications due to the fact that for many applications, downstream system components require negative rather than positive ions. Conventional negative ion sources may have, for example, a relatively short lifetime of only a few hundred hours. This lifetime decreases even further when operated at full power (e.g., 15 mA). Furthermore, conventional negative ion sources may encounter other problems including high power requirements (15 kW) and high gas load (18-20 sccm) on the downstream vacuum components.

A reliable, long lifetime negative ion source has applications in silicon cleaving for photovoltaic semiconductor applications, isotope production and separation, cyclotron injection systems, and accelerator mass spectrometry. Cyclotrons are widely used across medical and industrial fields. As technology continues to develop, it appears that ion source injectors could become limiting factors with regard to beam current and accelerator performance. There are several technical reasons why it is preferable to inject negative rather than positive ions into cyclotrons, and the low current and short lifetime of existing ion sources will potentially limit the performance of next-generation cyclotrons. Similarly, ion beams are used in a wide range of settings in the semiconductor industry. Better ion sources translate to cheaper, more efficient, and more effective production techniques for circuit components that are the building blocks of all modern IC-based technologies In another example, the negative ion source may be used in the field of magnetic confinement fusion energy. For decades scientists have sought to develop an energy source based on nuclear fusion reactions, as it could potentially provide an essentially unlimited amount of clean energy with virtually no harmful byproducts. Though fusion energy technologies have advanced immensely over the past several decades, there are still a number of technical challenges that prevented the development of a clean fusion energy reactor. One challenge faced by fusion energy is unreliable high current negative ion sources. Existing negative ion fusion injectors use filaments and/or magnetically coupled plasmas that suffer from many of the deficiencies discussed above. A reliable, long lifetime negative ion source could drastically increase the ion source conversion efficiency, lifetime, reliability, and current output. Developing such a negative ion source could be a major step forward in developing a clean, reliable fusion energy source.

A need exists for improved technology, including technology related to a new type of ion source that can produce high DC current output (up to 10 mA) and have a long lifetime (greater than 1 month).

SUMMARY

An exemplary embodiment relates to a pulsed or continuous wave negative ion source including a plasma chamber, a microwave source, a negative ion source converter, a magnetic filter and a beam formation mechanism. The plasma chamber contains a gas to be ionized. The microwave source transmits microwaves to the plasma chamber to ionize the gas into atomic species including hyperthermal neutral atoms. The negative ion source converter converts the hyperthermal neutral atoms to negative ions. The magnetic filter reduces the temperature of electrons between the plasma chamber and the negative ion source converter. The beam formation mechanism extracts the negative ions.

Another embodiment relates to a continuous wave negative ion source that includes a plasma chamber, a microwave source, a negative ion converter, a magnetic filter and a beam formation mechanism. The plasma chamber contains gas to be ionized. The microwave source transmits microwaves to the plasma chamber to ionize the gas into atomic species including hyperthermal neutral atoms. The negative ion converter converts the hyperthermal neutral atoms to negative ions. The magnetic filter reduces the temperature of electrons between the plasma chamber and the negative ion converter. The beam formation mechanism extracts the negative ions.

Yet another embodiment relates to a method of producing negative ions. The method includes providing a gas to be ionized in a plasma chamber, transmitting microwaves from a microwave source to the plasma chamber to ionize the gas such that hyperthermal neutral atoms of the gas are produced, converting the hyperthermal neutral atoms to negative ions via an interaction with a negative ion source converter, and extracting the negative ions with a beam formation mechanism.

Additional features, advantages, and embodiments of the present disclosure may be set forth from consideration of the following detailed description, drawings, and claims. More-over, it is to be understood that both the foregoing summary of the present disclosure and the following detailed description are exemplary and intended to provide further explanation without further limiting the scope of the present disclosure claimed.

BRIEF DESCRIPTION OF THE DRAWINGS

The accompanying drawings, which are included to provide further understanding of the invention, are incorporated in and constitute a part of this specification, illustrate embodiments of the present disclosure and together with the detailed description serve to explain the principles of the present disclosure. No attempt is made to show structural details of the present disclosure in more detail than may be necessary for a fundamental understanding of the present disclosure and the various ways in which it may be practiced.

FIG. 7 is a top view of the waveguide of FIG. 5.

FIG. 8 is a side view of the waveguide of FIG. 5.

DETAILED DESCRIPTION

Before turning to the figures, which illustrate the exemplary embodiments in detail, it should be understood that the present disclosure is not limited to the details or methodology set forth in the description or illustrated in the figures. It should also be understood that the terminology is for the purpose of description only and should not be regarded as limiting. An effort has been made to use the same or like reference numbers throughout the drawings to refer to the same or like parts.

Recent advances in positive ion sources using the resonant interaction of 2.45 GHz microwaves in gas in the presence of an 875 Gauss magnetic field have led to intense DC positive ion beams. Twenty five percent efficiency in converting gas into positive ions using 1 kW of microwave power has been routinely observed. Microwave ion sources are becoming increasingly common in commercial use due their inherent DC operating capability.

Referring generally to the figures, an exemplary embodiment relates to a negative ion source 100 capable of reliably operating above 10 mA for several months at a time using a mechanism to produce hyperthermal atoms (2-5 eV) via an interaction of a cesiated surface, and volume negative ion production techniques with a neutral atom beam generated by a microwave ion source that utilizes an electron cyclotron resonance at 2.45 GHz. The CW negative ion source 100 is a high current, high reliability, long lifetime negative ion source.

Figure 23:
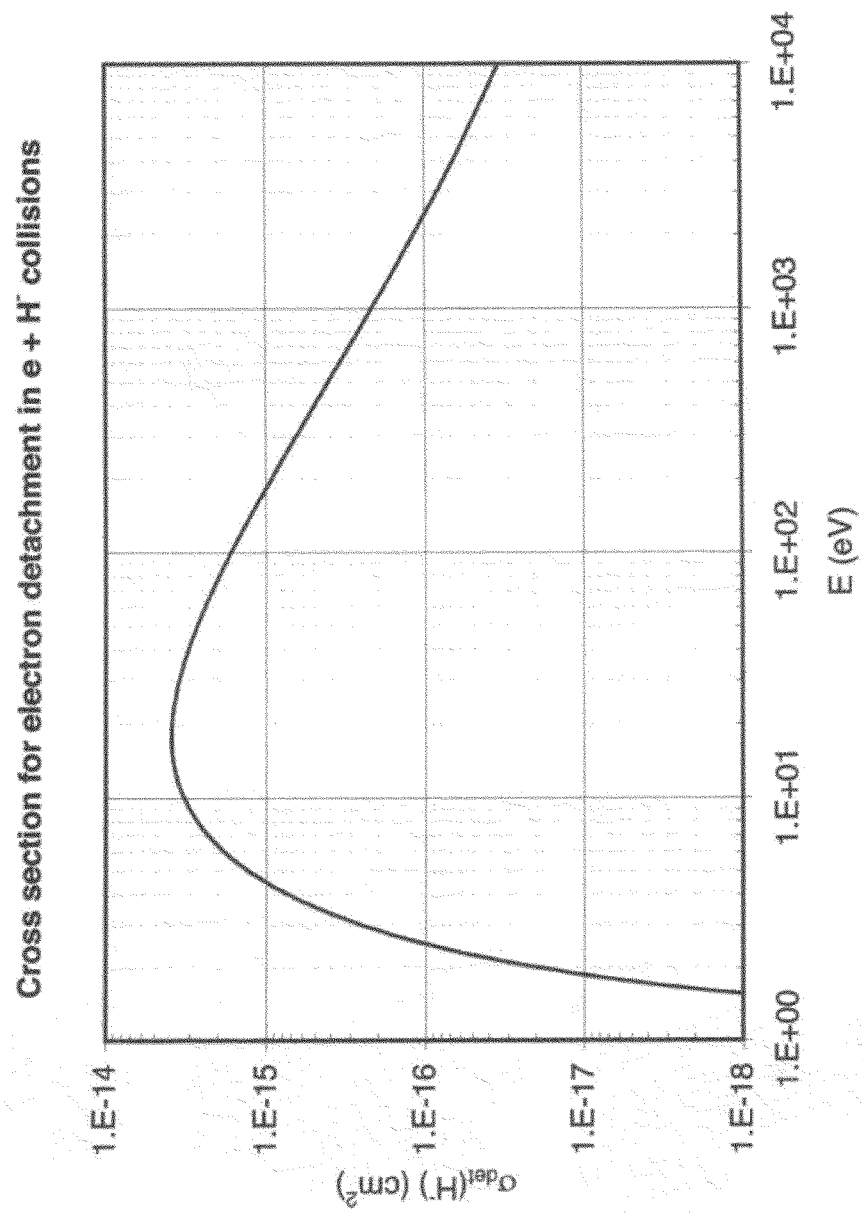
FIG. 23 illustrates a cross section for electron detachment in e+negative collisions.

In order to produce such a negative ion source, surface production of negative ions is built upon by scattering hyperthermal atoms from a cesiated low work function surface. Hyperthermal atomic energy refers to atom energies greater than 2 eV. The negative yield from atomic hydrogen) (H°) incident on a cesiated molybdenum surface is shown in FIG. 23. The four points are measurements, and the solid line is theoretical prediction. The hyperthermal contribution would occur in the range (1/kT)<1.

A significant advancement that has occurred since the Stevens Institute work described in Brian S. Lee and M. Seidl, Appl. Phys. Lett. 61 (24), 2857 (1992) (hereafter "Lee"), the entire contents of which is incorporated by reference herein, is the development of practical and proven 2.45 GHz microwave $H^+$ sources (MWS). This development is described, for example, in Terence Taylor and John S. C. Wills, Nuclear Instruments and Methods in Physics Research A309, 37 (1991) (hereafter "Taylor"), the entire contents of which is incorporated by reference herein. The MWS high gas and power efficiencies suggest that the plasma generator should also provide efficient production of neutral atom beams. The 2.45 GHz MWS plasma generator has demonstrated CW mode operation at many laboratories for many different industrial applications. Other neutral atom generators that have previously been investigated for this purpose are the multicusp source, the arc discharge source, and the 2.45 GHz Lisitano-Coil source.

Negative Beam Current and Emittance Considerations

For a circular aperture, a relationship between a normalized rms emittance ($\epsilon_{rms,n}$) and the extracted negative ion temperature is described as follows:

$$\epsilon_{rms,n} = (r/2)\sqrt{kT/(mc^2)} \tag{1}$$

where r is the radius of the emission aperture, kT is the plasma ion temperature, and $mc^2$ is the rest mass of the negative ion.

A concept related to emittance is beam brightness, B. This may be defined as $B=I/(\epsilon_x\epsilon_y)$ where $\epsilon_x$ and $\epsilon_y$ are the transverse beam emittances. For purposes of this disclosure, where an axisymmetric source is expected, the definition of B becomes $$B=I/\epsilon_r^2 \qquad (2)$$

where $\epsilon_r$ is the beam emittance in (r,r') space. In one embodiment, the desired current is I=10 to 15 mA.

The negative ion current density, $j_-$, is defined by the following equation:

$$j_-=I/(r^2). \qquad (3)$$

If one solves equation (3) for r, substitutes that relationship into equation (1), and then uses that emittance expression in equation (2), one arrives at the following expression for beam brightness:

$$B=j/(kT). \qquad (4)$$

According to equation (4), a brighter ion source is directly related to the extracted current density j, and inversely related to the ion temperature, kT.

Using the equations described above, in theoretical Example 1, an ion emission aperture has a radius r=0.4 cm and I=10 mA. Equation (3) gives $j_-$=20 mA/cm². Considering 500 mA/cm² atomic hyperthermal hydrogen density was measured in Lee, it is very likely that at least 4% of this atomic hydrogen flux could be converted to negative ions. Furthermore, substituting several eV ion temperature into equation (1) gives a normalized rms emittance considerably lower than a radio frequency quadrupole (RFQ) input beam design emittance of 0.25 (πmm-mrad), rms normalized ($\epsilon_{rms,n}$) Thus, from the parallel negative ion energy measurements reported in [1], a few eV negative ion temperature is expected.

The following sections provide details on coupling a modern 2.45 GHz microwave plasma source to a cesiated converter surface. Then, an ion extraction system is proposed which simultaneously accelerates the negative ion beam to 35 keV and separates the parasitic electron component. The goal is to achieve the beam quality described above with a long run time (greater than 6 months) negative ion source.

Hyperthermal Neutral Hydrogen Atom Generation

Referring to the figures, an exemplary embodiment of a system for producing a CW negative ion source 100 includes a microwave source 110, an ion source plasma chamber 120, a waveguide 130, a magnetic filter 140, a negative ion converter 150 and a negative ion beam formation mechanism 160.

Figure 18:
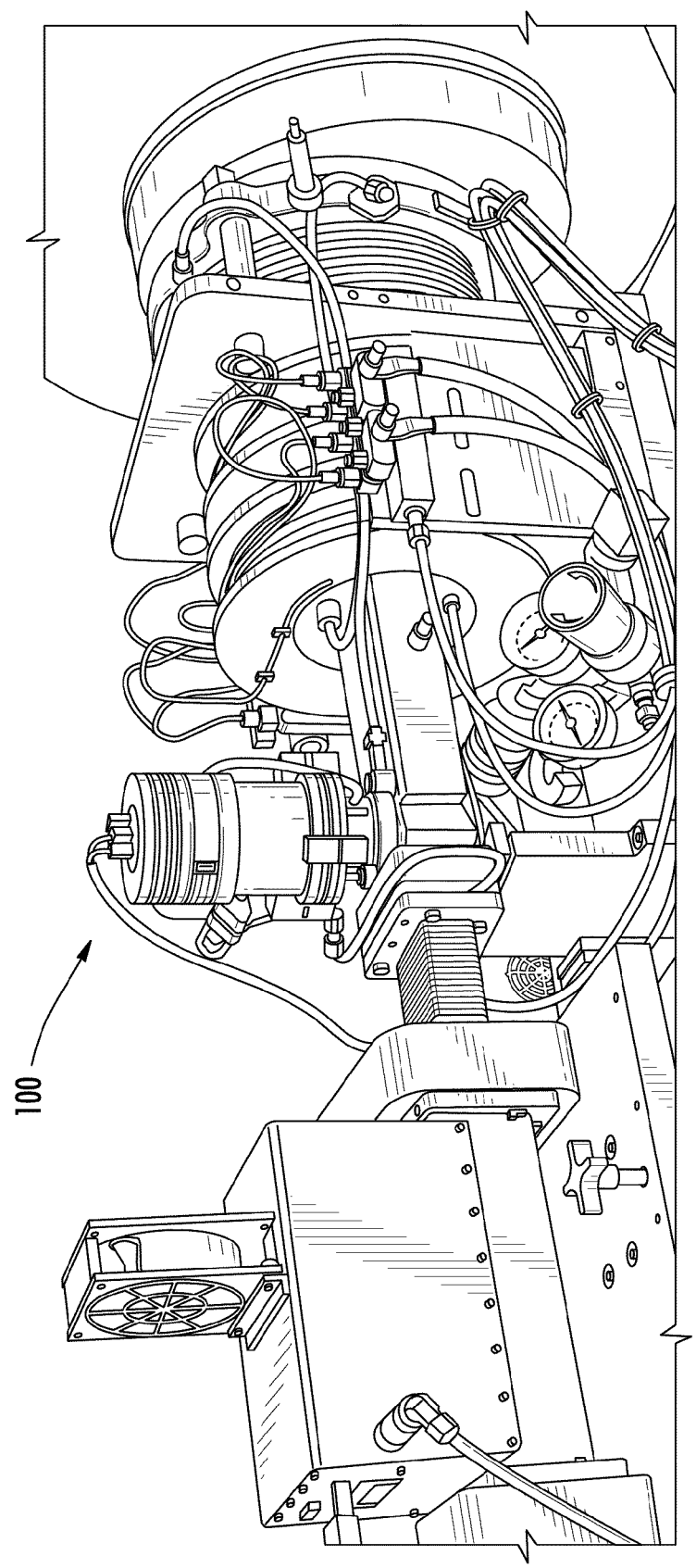
FIG. 18 illustrates the positive ion source of FIG. 1.

In one embodiment, the microwave source 110 is a 2.45 GHz microwave source. The microwave source 110 is configured to transmit microwaves that ionize gas provided in the ion source plasma chamber 120 to convert the molecular gas into atomic species, in particular, hyperthermal neutral atoms. The microwave source 110 works on an electron cyclotron resonance (ECR) principle, thus requiring an ~875 G on-axis magnetic field. FIG. 18 illustrates a positive deuterium ion source.

The MWS has consistently demonstrated high gas efficiency and high proton fraction (~90%). The gas efficiency h is defined as the fraction of proton or deuteron gas nuclei (in the form of the molecular gas) converted to charged particle beam. In practical units, h is given by $$h=6.95\times I(A)/Q(sccm). \qquad (5)$$

A LEDA proton accelerator at Los Alamos is described in Joseph D. Sherman, et. al., Review of Scientific Instruments 73(2), 917(2002), the entire contents of which is incorporated by reference herein. The LEDA proton accelerator produced 154 mA of hydrogen ions at 4.1 sccm gas flow at 90% proton fraction. This gives $h_{Hn+}$=0.26. In comparison, the deuteron ion source of the present application has produced up to 53 mA at 45 keV beam energy with 1.9 sccm gas flow. This gives a deuteron ion production efficiency $h_{Dn+}$=0.19.

Theoretically, dissociation of molecules to neutral atoms followed by ionization of the neutral atoms to positive ions is more likely than ionization of molecules to negative molecular ions followed by disassociation of negative molecular ions to positive ions. Thus, a good atomic ion source should also be a good neutral atom beam source. The 150 mA beam current observed in the LEDA MWS corresponds to $0.9\times10^{18}$ charged particles/sec (p/s). At 4.1 sccm $H_2$ gas flow, the number of neutral hydrogen atoms entering the source is $3.7\times10^{18}$ p/s. Correcting this latter number for charged particles leaving the source results in $2.8\times10^{18}$ neutral hydrogen atoms/s leaving the source. The emission aperture radius for the LEDA ion source is 0.43 cm, which gives an area of 0.58 cm². If all the neutral particles leaving the LEDA MWS are in the form of dissociated $H_2$ molecules, the H° electrical equivalent current density is 747 mA/cm². Therefore, to function as a 10 mA/cm² negative ion source, a 1.3% conversion efficiency from neutral atoms to negative ions would be required.

Figure 20:
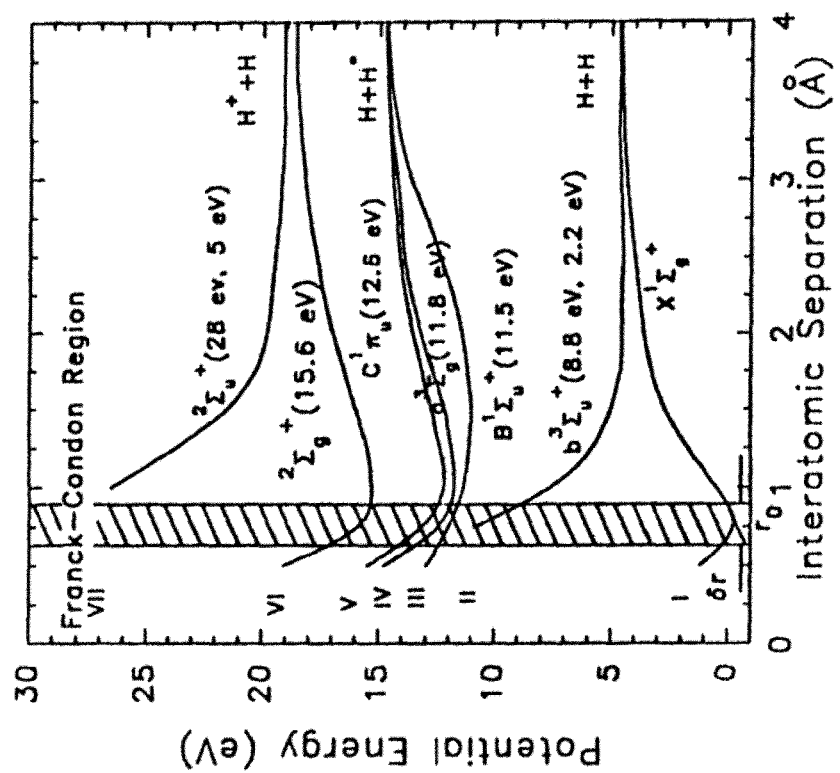
FIG. 20 is a potential energy diagram for the $H_2$ molecule.
Figure 21:
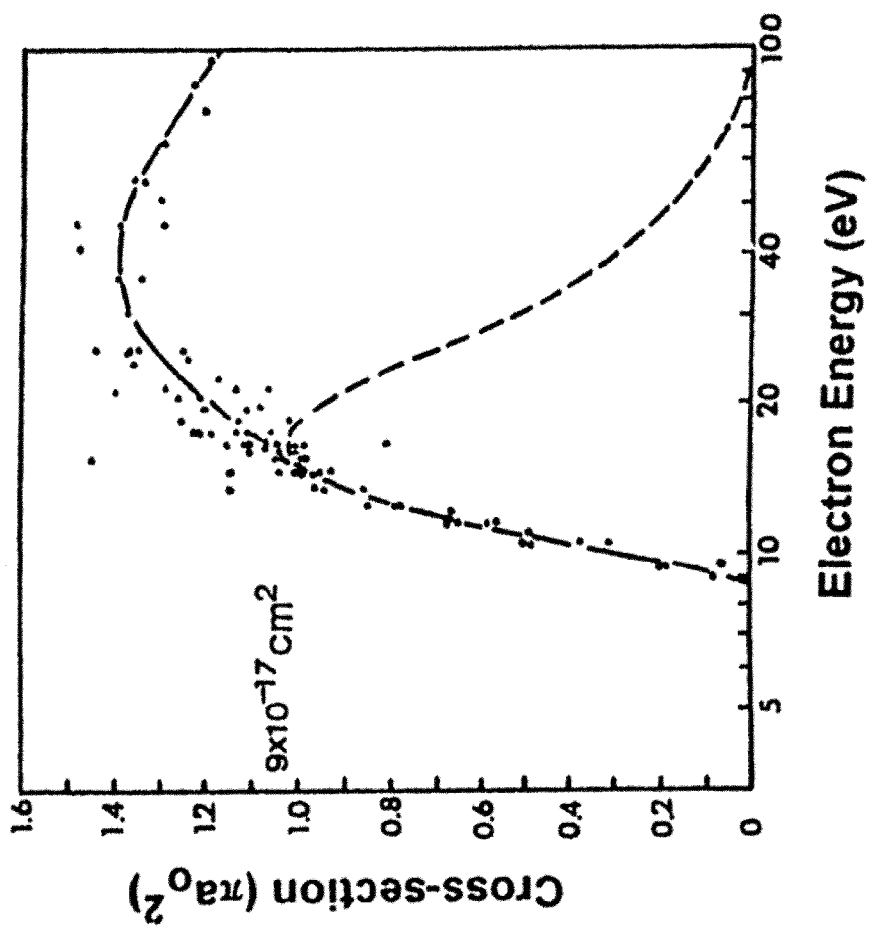
FIG. 21 illustrates electron impact $H_2$ molecular dissociation cross sections.
Figure 22:
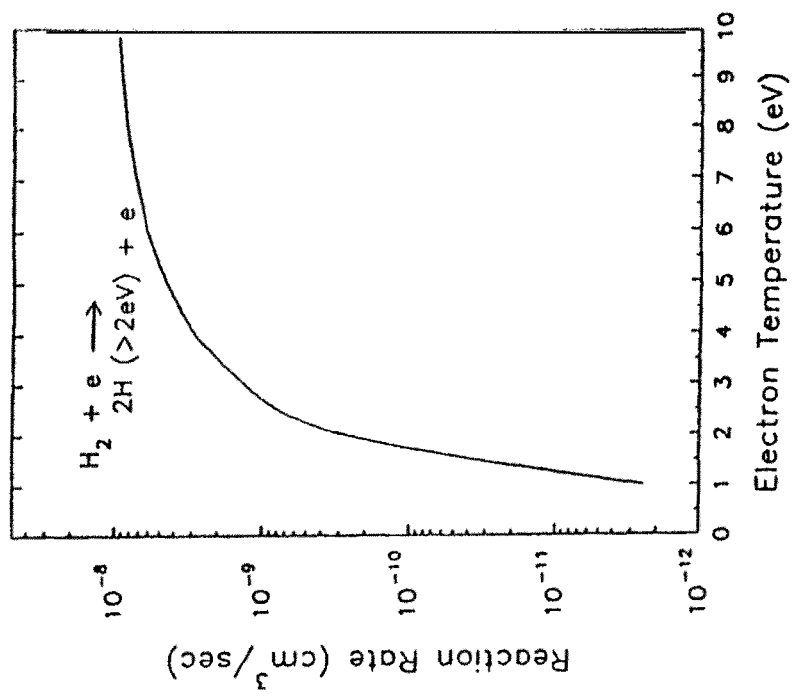
FIG. 22 illustrates calculated dissociation rates of $H_2$ molecules via electron collisions with energies from Maxwellian distributions characterized by an electron temperature.

Hyperthermal H° (energy >2 eV) may be generated by a high temperature electron plasma through the Franck-Condon dissociation mechanism of the $H_2$ molecule described in Brian S. Lee, "Surface Production of negative Ions by Backscattering Hyperthermal Hydrogen Atoms", Ph.D. Thesis, Department of Physics and Engineering, Stevens Institute of Technology, Castle Point Station, Hoboken, N.J. (1993) (hereafter "Brian S. Lee"), the entire contents of which is incorporated by reference herein. The Franck-Condon region in the potential energy curves for electronic states up to 30 eV for the $H_2$ and $H_2^+$ molecules are shown in FIG. 20. Onset and minimum separation energies for dissociated H° and H⁺ are shown. Dissociation cross sections for the $H_2$ molecule are shown in FIG. 21. Both FIGS. 20 and 21 indicate an electron energy threshold of about 8.8 eV for direct dissociation of the $H_2$ molecule. The reaction rates <sv> calculated from the dissociation cross sections and electron velocities (based on Maxwellian distributions with temperature $kT_e$) are shown in FIG. 22. The dissociation reaction rates tend to saturate around 8 eV electron temperature.

Taylor reported that double cylindrical Langmuir probe measurements typically gave 20 eV electron temperatures. This high temperature puts the $H_2$ dissociation reaction rate into the saturated portion of FIG. 22. This experimental data combined with the theory presented above suggests that molecular dissociation rates will be high in the negative ion source of the present application.

Eqns. (4)-(5) give the continuity equation for the production and loss rates of H°:

$$n_e n(H_2)<sv_e>V=n_{Ho}v_{Ho}A/(4a) \qquad (6)$$

where $n_e$=electron density in LEDA MWS
$n(H_2)$=density of $H_2$ in the LEDA MWS
V=LEDA ion source plasma volume
A=LEDA ion source plasma surface area a=destruction probability of H° on bounce from wall
l=V/A=LEDA ion source length By invoking plasma charge neutrality ($n_+=n_e$), solving for $n_+$ from the positive current density extracted from $j_+=n_+v_+$ =0.26 A/cm$^2$, and taking $v_+$ from a reasonable plasma ion temperature of 1 eV, the following Eqn. (7) is obtained:

$$n_e=1.2\times 10^{12} e/cc \qquad (7)$$

The density of $H_2$ in the LEDA MWS ($n(H_2)$) is found by assuming molecular $H_2$ flow through a 0.86 cm diameter emission aperture, calculating source pressure (T) at 4 sccm $H_2$ gas flow, and converting the source pressure to number density through the use of Loschmidt's number. The result is $$n(H_2)=7.1\times 10^{13} H_2/cc \qquad (8)$$

Figure 15:
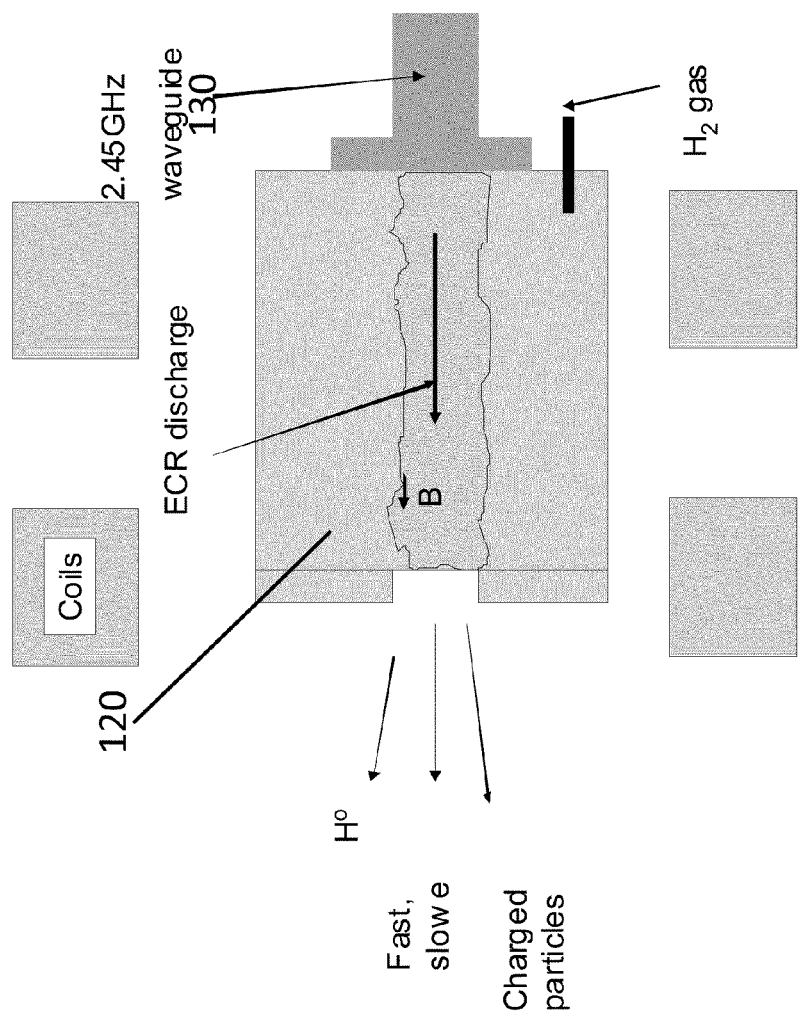
FIG. 15 is a schematic illustration of the negative ion source of FIG. 1.
Figure 16:
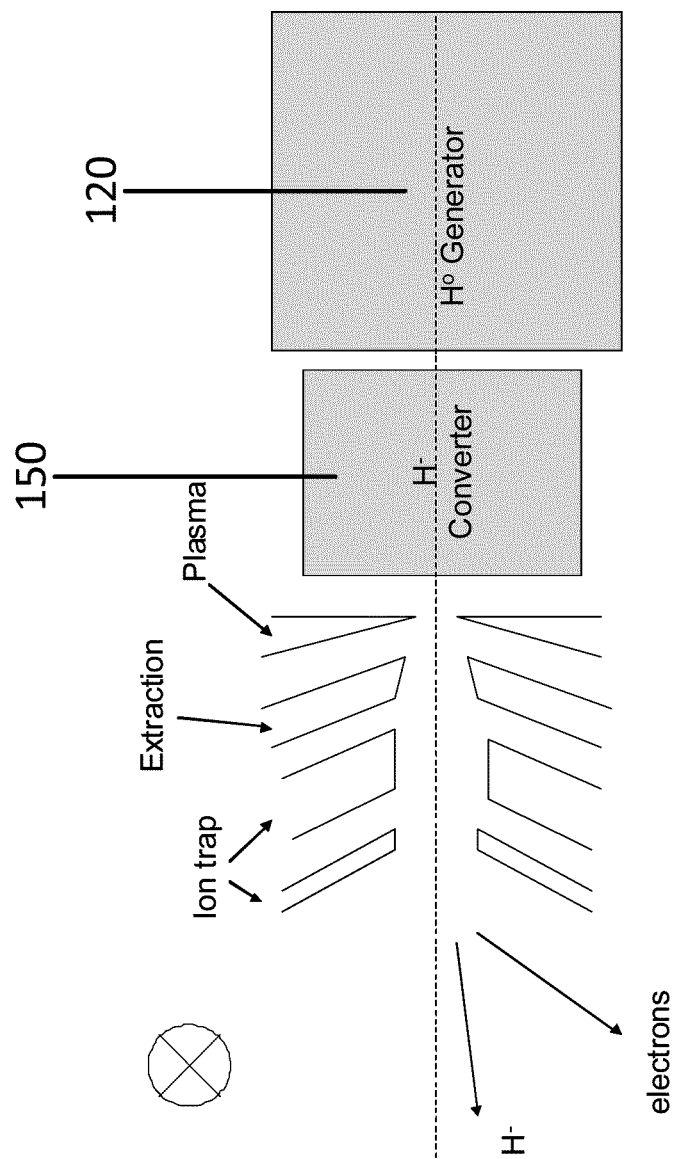
FIG. 16 is another schematic illustration of the negative ion source of FIG. 1.

Solving for the H° flux ($H_o$) from eqn. (6) and substituting the LEDA ion source parameters and maximum $<sv_e>=7.8\times 10^{-9}$ cc/s from FIG. 21, one finds $$F_{Ho}=n_{Ho}v_{Ho}/4=an_e(n(H_2)<sv_e>l=6.6\times 10^{18} H°/(cm^2-s) \qquad (9)$$

where a=1 is assumed. Converting $F_{Ho}$ to a charge equivalent, one of ordinary skill in the art calculates 1.056 A/cm$^2$. In the discussion above, it was found that the highest H° flux would be 0.75 A/cm$^2$. This analysis suggests that the 2.45 GHz MWS in $TE_{100}$ mode is likely an excellent source of hyperthermal H°. FIG. 15 shows a conceptual animation of the principal components in the proposed 2.45 GHz H° source.

It is desirable to have the plasma chamber 120 at high voltage and the microwave source 110 at ground potential. Thus, the plasma chamber 120 and microwave source 110 must be electrically isolated. This is accomplished by transmitting the microwaves generated by the microwave source 110 into the plasma chamber 120 via a waveguide 130.

Figure 5:
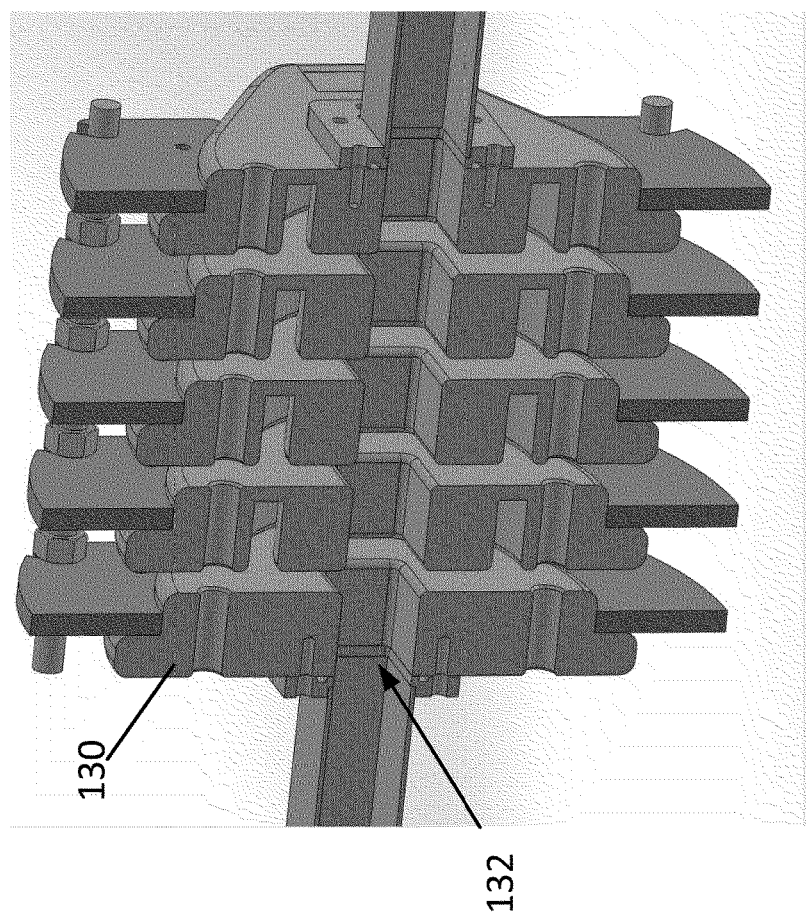
FIG. 5 is an isometric cross-sectional view of a waveguide break of a waveguide of the negative ion source of FIG. 1.
Figure 6:
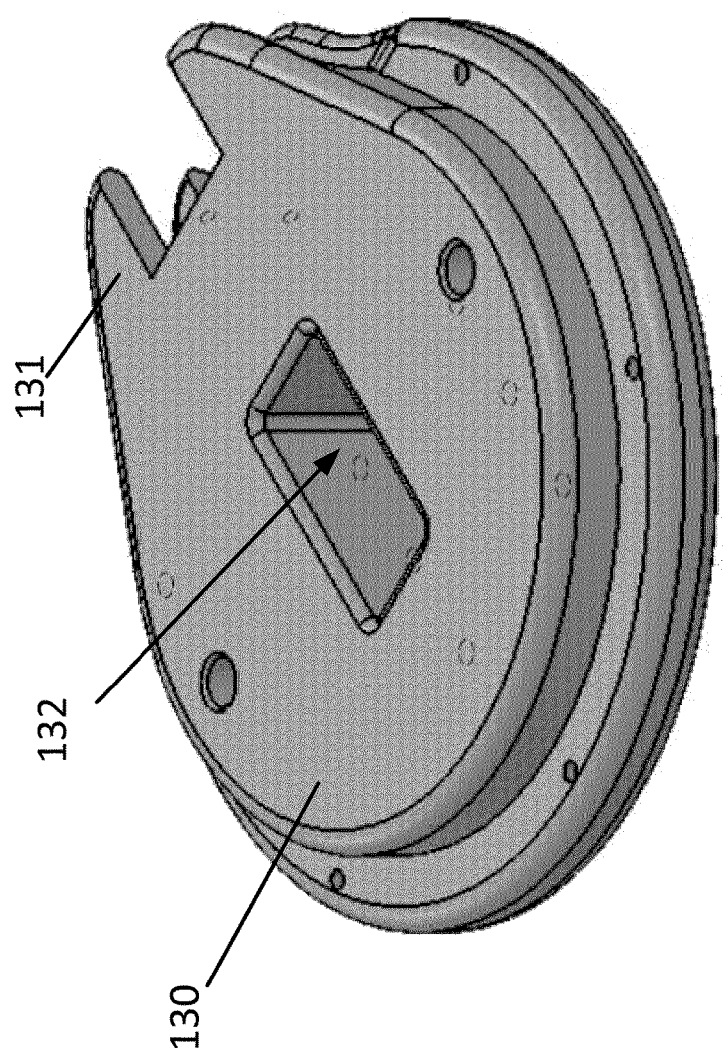
FIG. 6 is an isometric view of the waveguide of FIG. 5.
Figure 9:
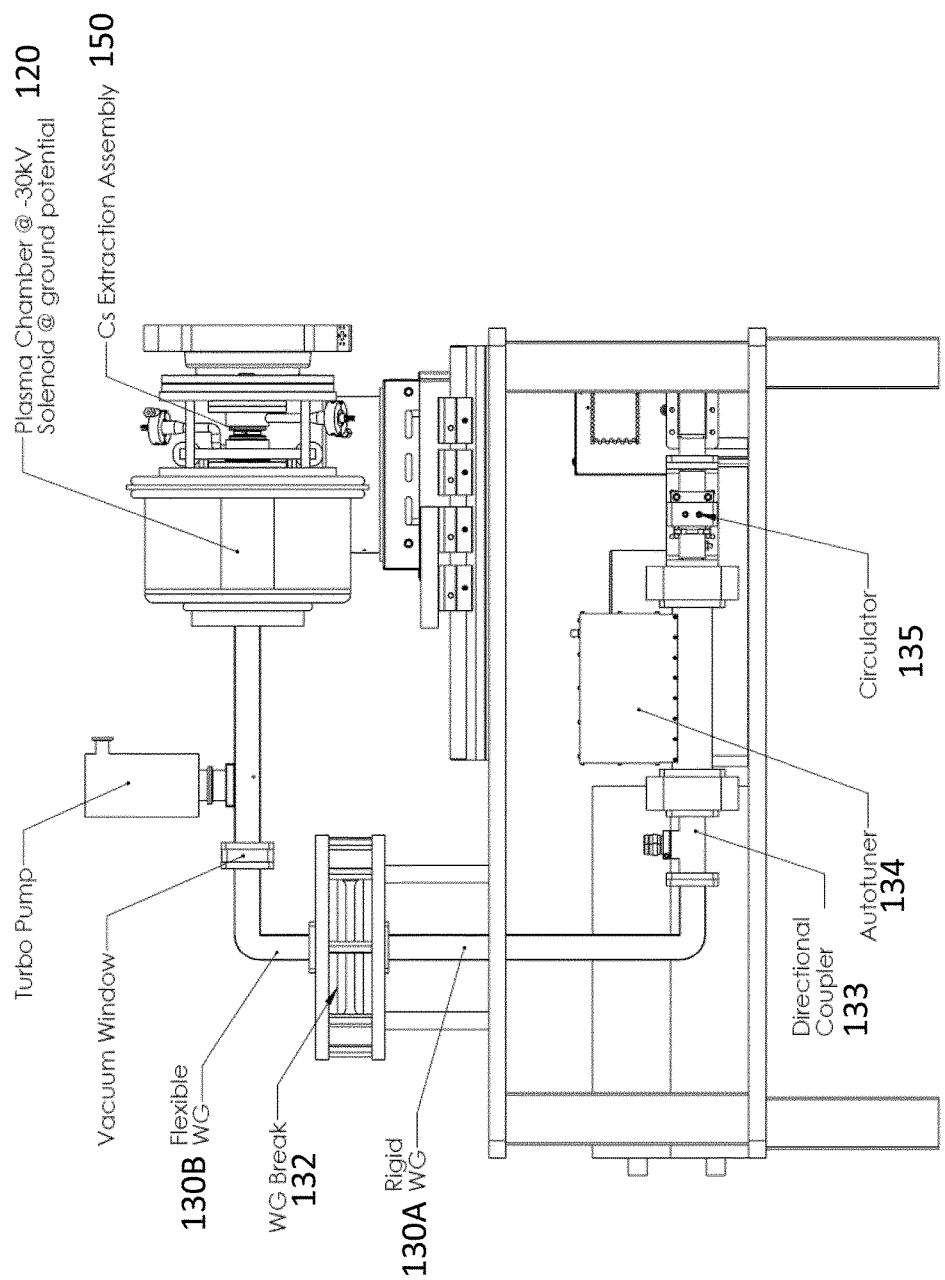
FIG. 9 is a schematic side view of a microwave source of the negative ion source of FIG. 1.
Figure 10:
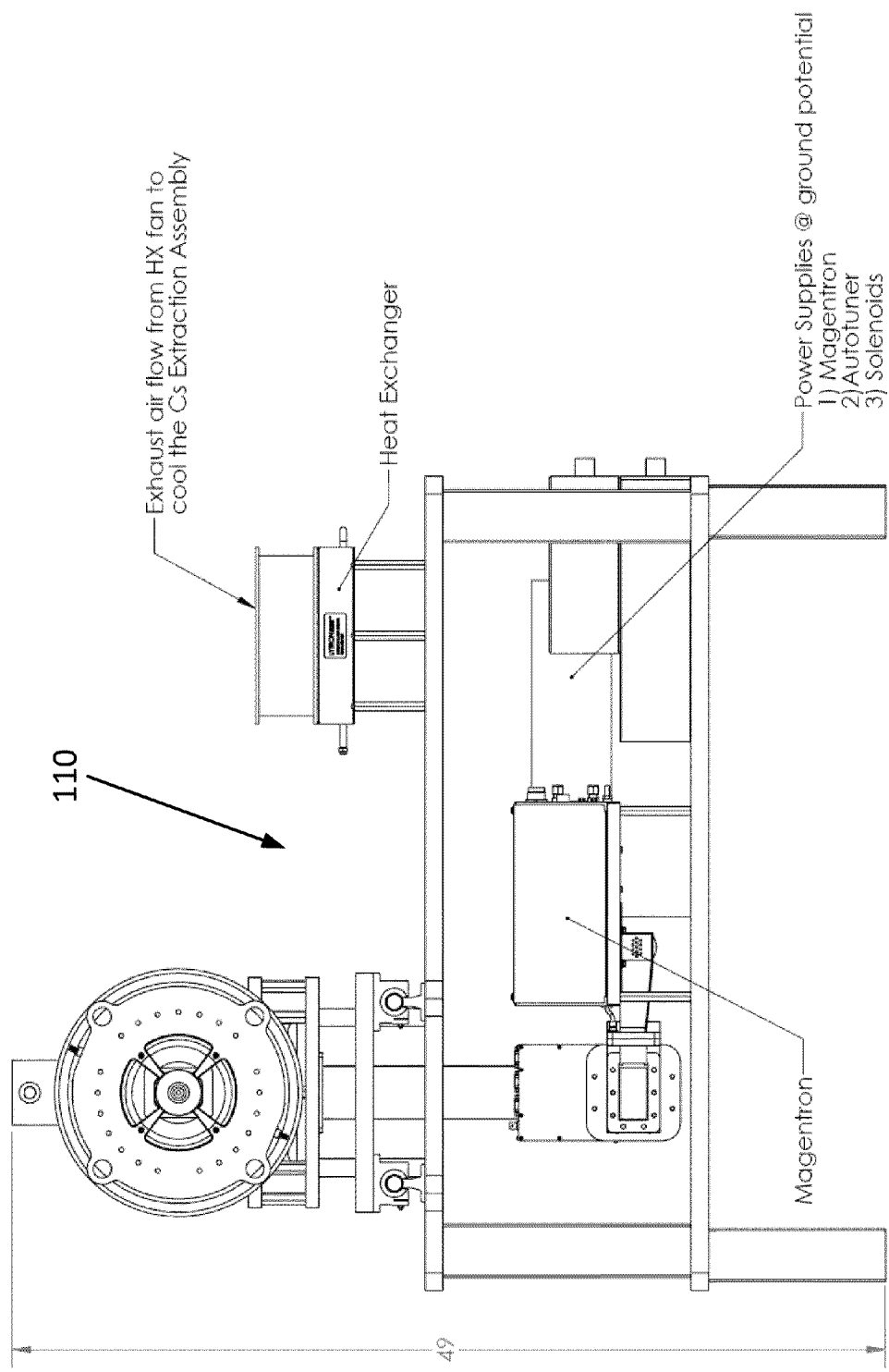
FIG. 10 is a schematic front view of a microwave source of the negative ion source of FIG. 1.
Figure 11:
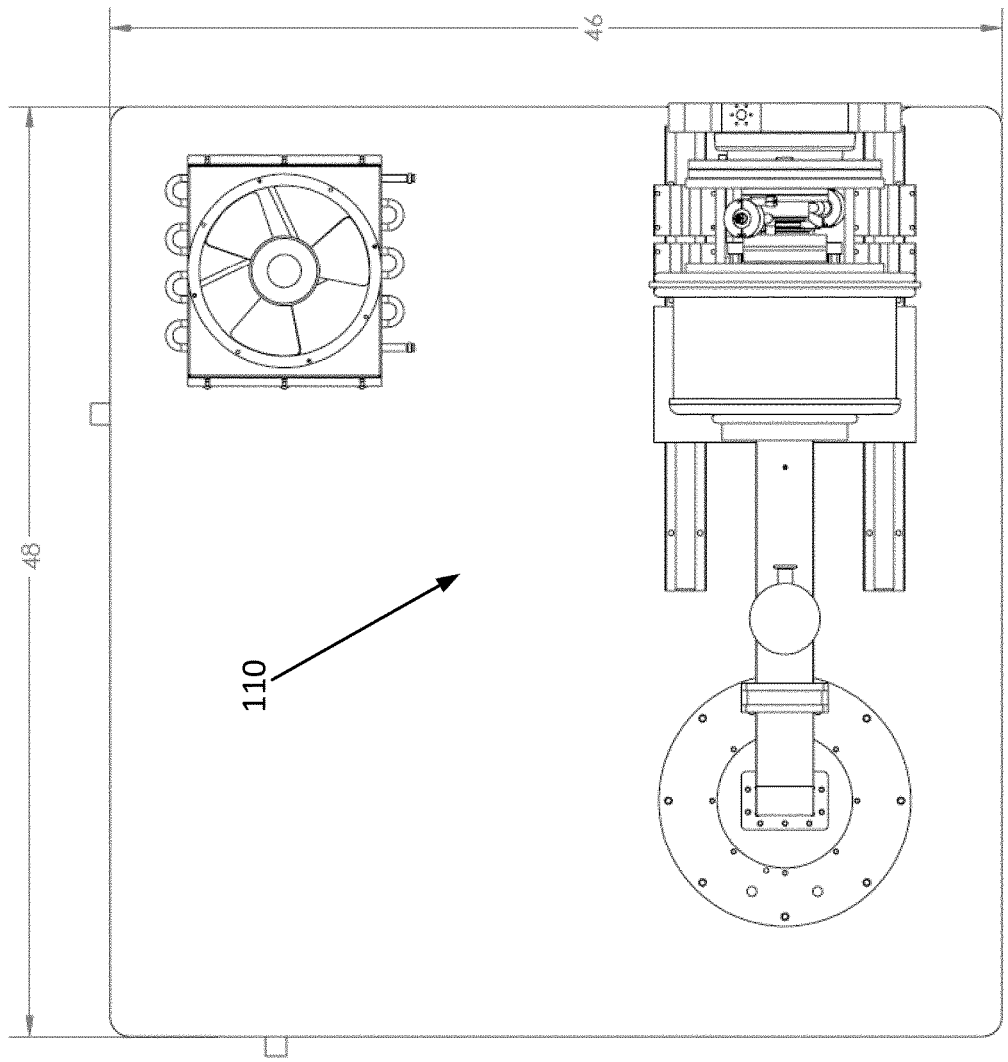
FIG. 11 is a schematic top view of a microwave source of the negative ion source of FIG. 1.
Figure 12:
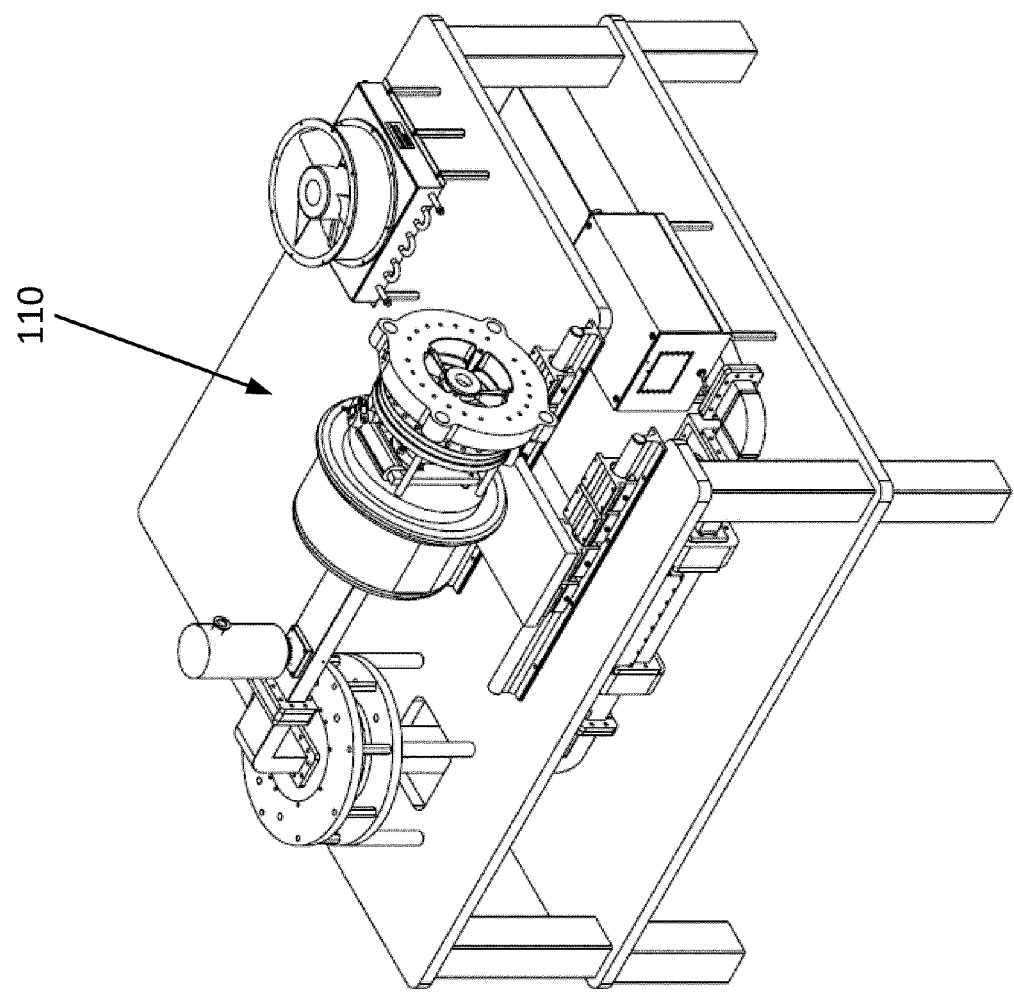
FIG. 12 is a schematic isometric view of a microwave source of the negative ion source of FIG. 1.
Figure 13:
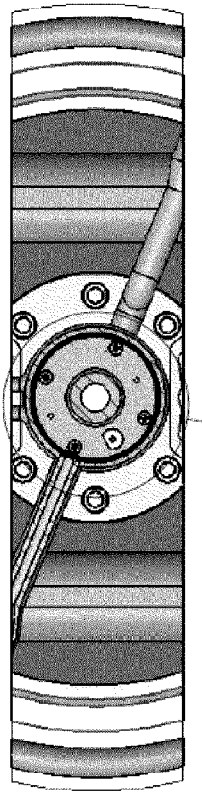
FIG. 13 is a front view of a negative ion converter of the negative ion source of FIG. 1.
Figure 14:
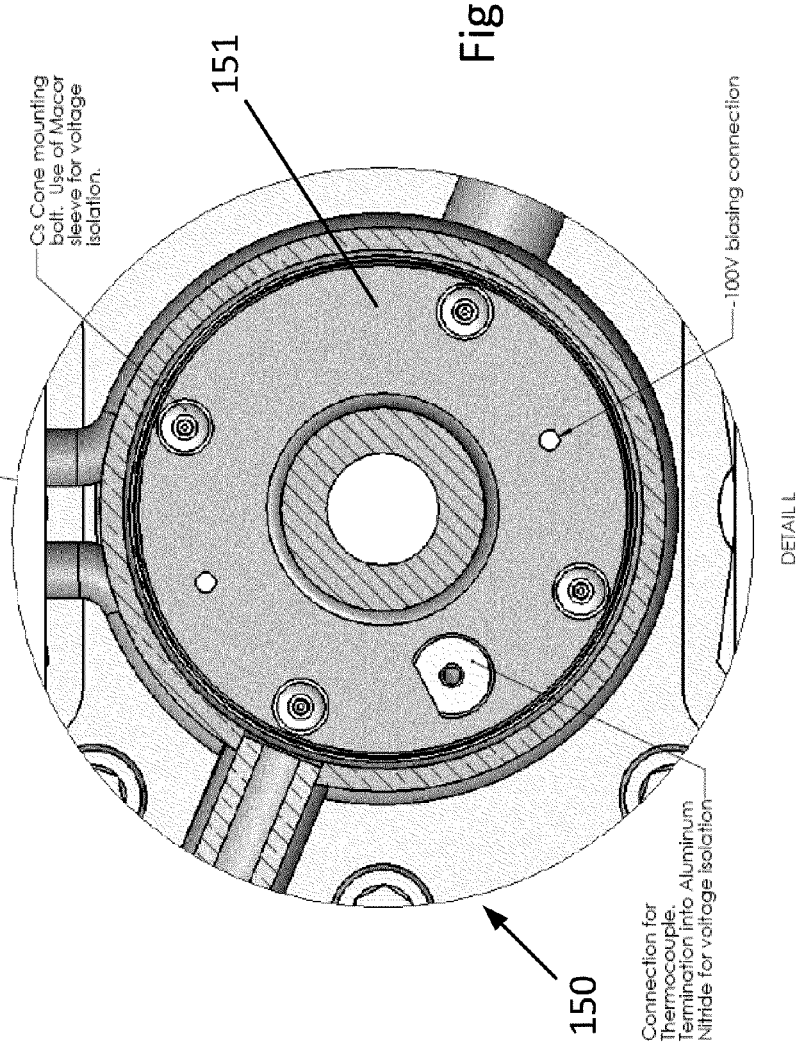
FIG. 14 is another front view of a negative ion converter of the negative ion source of FIG. 1.

In one embodiment, the waveguide 130 is generally disk-shaped, including a flange 131 and a waveguide break 132 in the center of the waveguide 130 (see FIGS. 6 and 7). The waveguide break 132 is configured to be insulated with air. A plurality of waveguides 130 may be stacked (see FIG. 5) or a single waveguide 130 may be used to deliver the microwave power from the microwave source 110 to the plasma chamber 120. The waveguide 130 may be rigid at one end 130A of the waveguide break 132, while flexible at the other end 130B of the waveguide break 132 (i.e., the end closest to the plasma chamber 120) in order to facilitate installation and maintenance of the waveguide.

The waveguide 130 may include commercially available components such as a directional coupler 133, an autotuner 134 and a circulator 135. The directional coupler 133 is configured to detect the phase and amplitude of a microwave to determine both its forward and reflected power. The autotuner 134 is configured to match the load impedance (i.e., the impedance of the plasma chamber 120) to that of the source (i.e., the microwave source 110), thereby reducing reflected power and maximizing the coupling power to the plasma chamber 120. In order to match the impedances between the microwave source 110 and the plasma chamber 120, stubs 136 may be inserted at different lengths and various depths along the waveguide 130 based on instructions generated by the autotuner 134. The circulator 135 is three-port device configured to selectively direct microwaves to a specific port based on the direction of wave propagation. In order to protect the microwave source 110 from reflected microwave energy and to increase the efficiency of microwave generation, the circulator 135 may include a "dummy" load configured to absorb the reverse power.

Negative Ion Conversion

The negative ion converter 150 is configured to direct an atomic beam onto a cesiated surface 151, for example, a cesiated molybdenum plate, where the atomic beam is converted to negative ions via cesium catalysis. The surface of the negative ion converter 150 is at a negative potential such that the negative ions are accelerated and deflected by an ambient 875 Gauss magnetic field. The negative ion converter 150 is located adjacent to an emission hole appropriate for negative ion extraction in order to form a low energy negative ion beam. Ion beam diagnostics may be provided to monitor neutral particle energy (calorimetric), neutral particle flux, and electron temperature and density near the extractor.

The negative ion beam is formed in a reduced plasma density environment. The neutral atoms will leave the 2.45 GHz plasma chamber accompanied by other charged particles including hot and cold electrons, as well as positive ions. It is important to reduce the high temperature electron density in the region of the negative ion converter 150. If the temperature is not reduced, for example, the efficiency of the negative ion source is decreased. A well known negative ion destruction cross section (see FIG. 23) is the impact of negative ions by electrons with energy >2 eV. The rapid decrease in the cross section at electron energies less than 1 eV arises because the H° electron affinity is 0.75 eV. To prevent this occurrence, the plasma chamber 120 and the negative ion converter 150 are separated by a magnetic filter 140. In one embodiment, the magnetic filter 140 may be a tunable magnetic dipole field. The magnetic filter 140 is provided circumferentially around the junction between the plasma chamber 120 and the negative ion converter 150.

Figure 24:
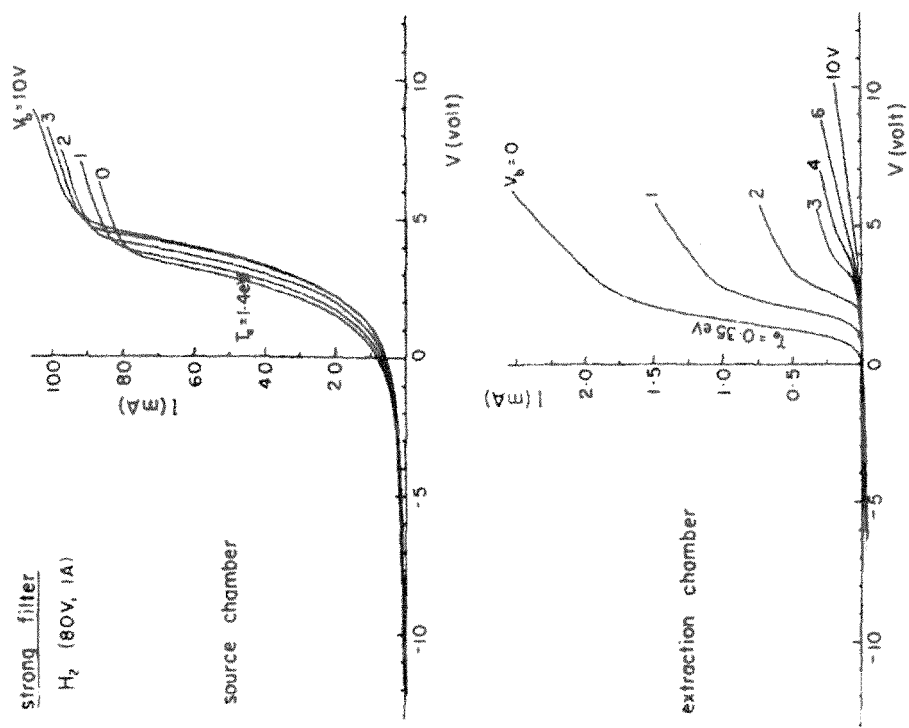
FIG. 24 illustrates Langmuir probe measurements for the two-chamber multicusp negative ion source.

As described in K. N. Leung, K. W. Ehlers, and M. Bacal, "Extraction of Volume Produced negative Ions from a Multicusp Sources", Rev. Sci. Instrum. 54(1), 56 (January, 1983) (hereafter "Leung"), the entire contents of which is incorporated by reference herein, a magnetic filtering technique using a magnetic filter 140 between the H° production chamber and the negative extraction region has been shown to reduce electron temperatures in the extraction region. FIG. 24 shows Langmuir probe measurements from Leung taken in a magnetically-filtered cusp field negative source. The top portion of the figure shows probe traces in the source chamber where an electron temperature of 1.4 eV is measured. The lower portion of FIG. 24 shows the probe traces in the extraction chamber, and the electron temperature there has been reduced to 0.35 eV. Considering the very high electron temperatures observed in the microwave source, a magnetic filter will be required to reduce the electron temperature.

By addressing challenges including high negative ion temperature and difficulty reducing the high temperature electron density at the converter and extractor regions, the system will produce a long-lived, high current density, DC negative ion source. Furthermore, negative ion source may decrease power requirements by 85% and downstream gas load by 80% relative to existing high current negative ion sources.

Figure 17:
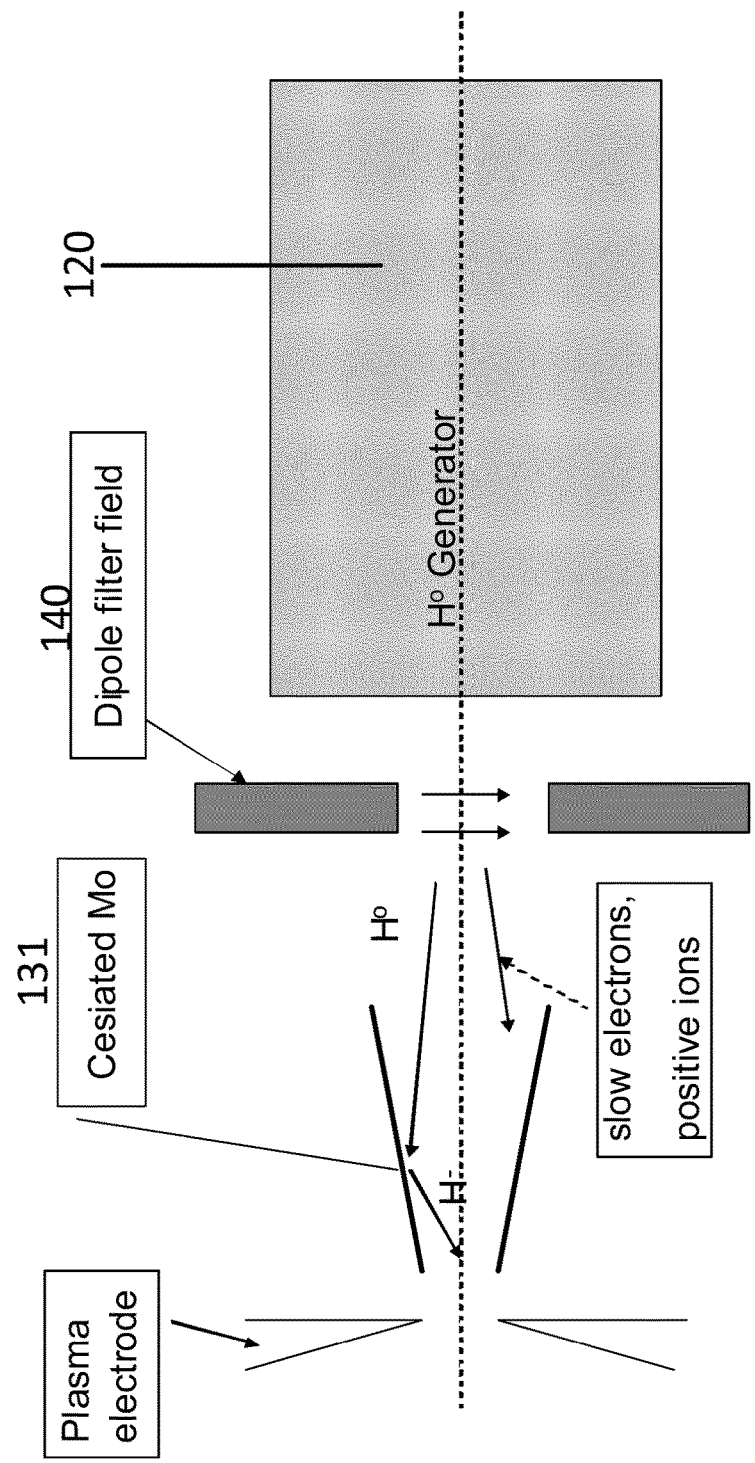
FIG. 17 is another schematic illustration of the negative ion source of FIG. 1.
Figure 19:
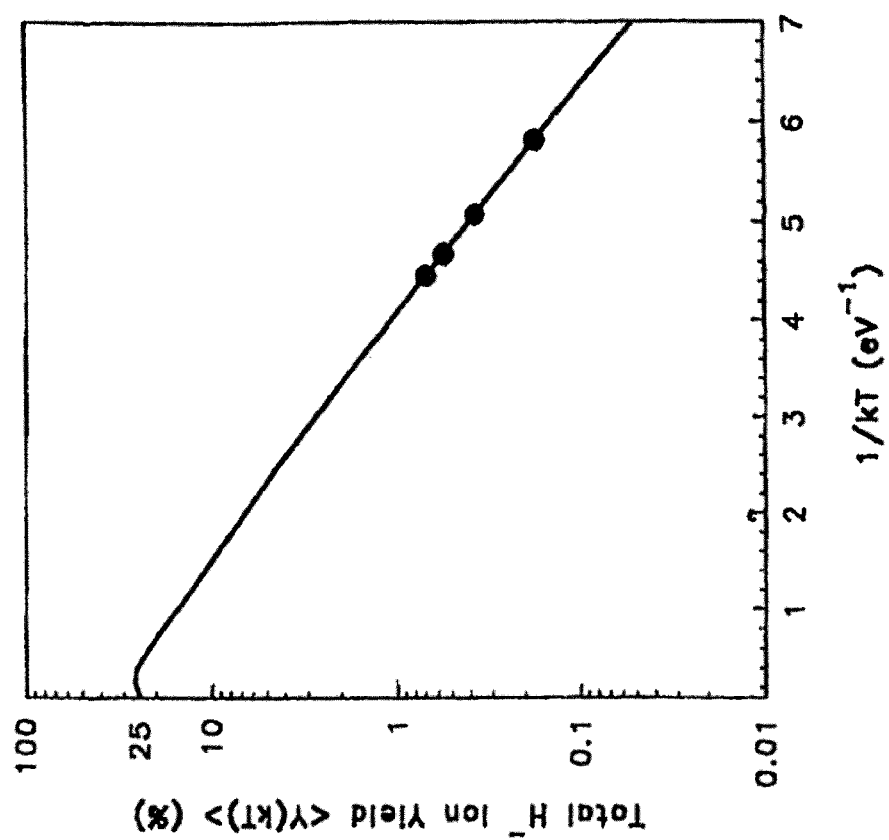
FIG. 19 is a graph illustrating negative yield of a cesiated molybdenum surface under bombardment of neutral atoms.

FIG. 17 shows a schematic layout of the negative ion production and extraction region. The neutral atoms progress from right to left, moving from the plasma chamber 120 (i.e., the neutral atom generator) through the dipole magnetic filter 140. Fast electrons are removed by the filter 140 from the source particle flux. Slow electrons and positive ions pass through the filter 140 by mechanisms discussed in Leung. The neutral atoms pass through the filter field, and some neutral flux strikes the negative ion converter 150 (i.e., the cesiated molybdenum surface converter). This leads to negative ion formation with yield determined by neutral atom conversion efficiency (as shown in FIG. 19). The negative ion converter 150, may be for example, a long cone (see FIG. 17) to maximize a surface area for negative ion production and to provide as large a solid angle as possible for capturing the surface-produced negative ions.

The cesiated molybdenum surface should be heated before the first application of the cesium metal from a cesium dispenser. It may be necessary to continuously feed Cs to maintain the low work function surface for optimum negative ion yield. The converter surface should also be isolated from ground, as imposing some small negative voltage on the converter may enhance the negative ion yield.

The total negative ion yield $<Y(kT)>$ shown in FIG. 19 is plotted vs. $(1/kT)$. This quantity is obtained from an integral of a Maxwellian neutral atom energy distribution over a negative ion yield as a function of the perpendicular energy of the back scattered atom. The points in FIG. 19, located in the $(1/kT)$ range of 4-6 eV, are taken from thermal-atom yield measurements. The solid line is a theoretical result for predicted electron transfer to reflected neutral atoms from a metal surface.

Langmuir probe measurements will be made after the magnetic filter in the converter region of the ion source. A filter modified from that used in Leung will most likely be required because of the high electron temperature of the microwave source. A continuously variable electromagnet may be preferred.

Negative Ion Extraction

Figure 1:
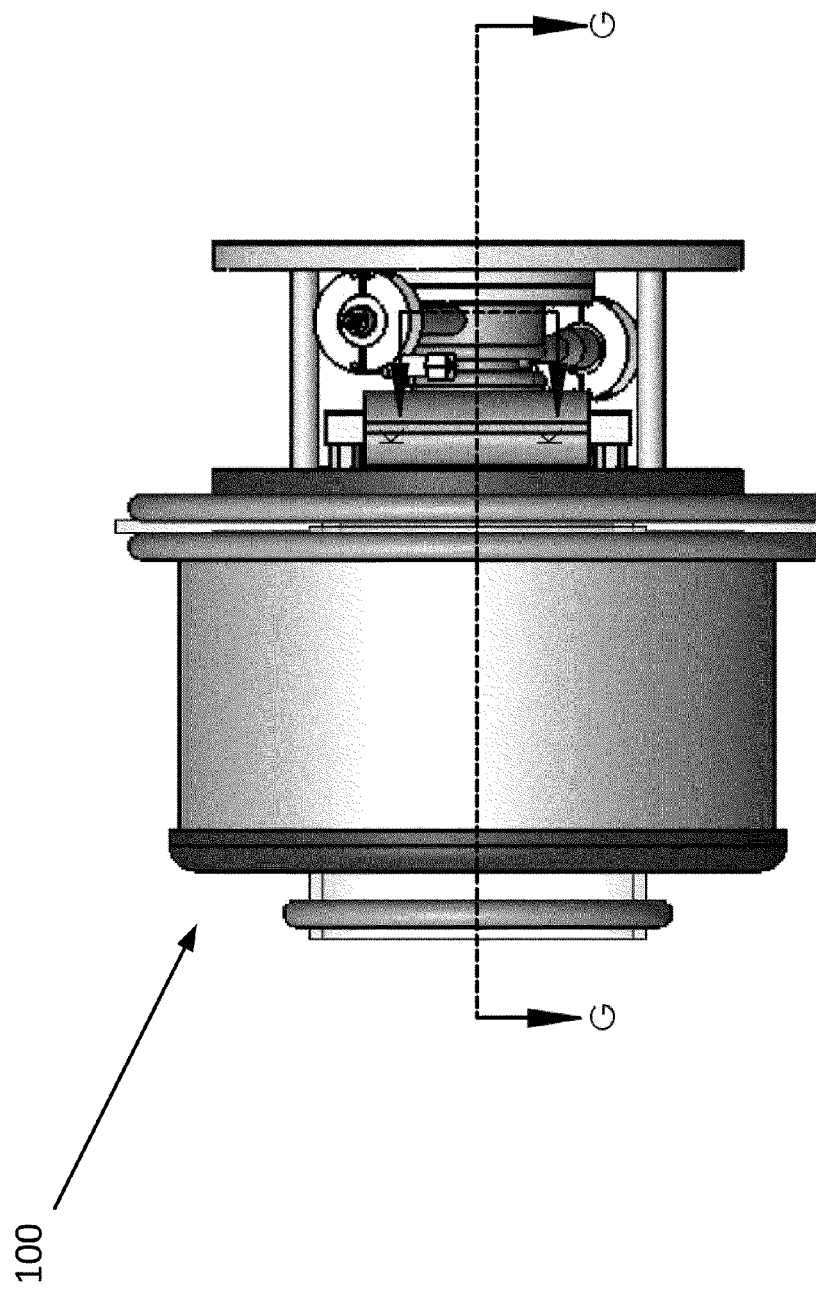
FIG. 1 is a top view of an exemplary embodiment of a negative ion source.
Figure 2:
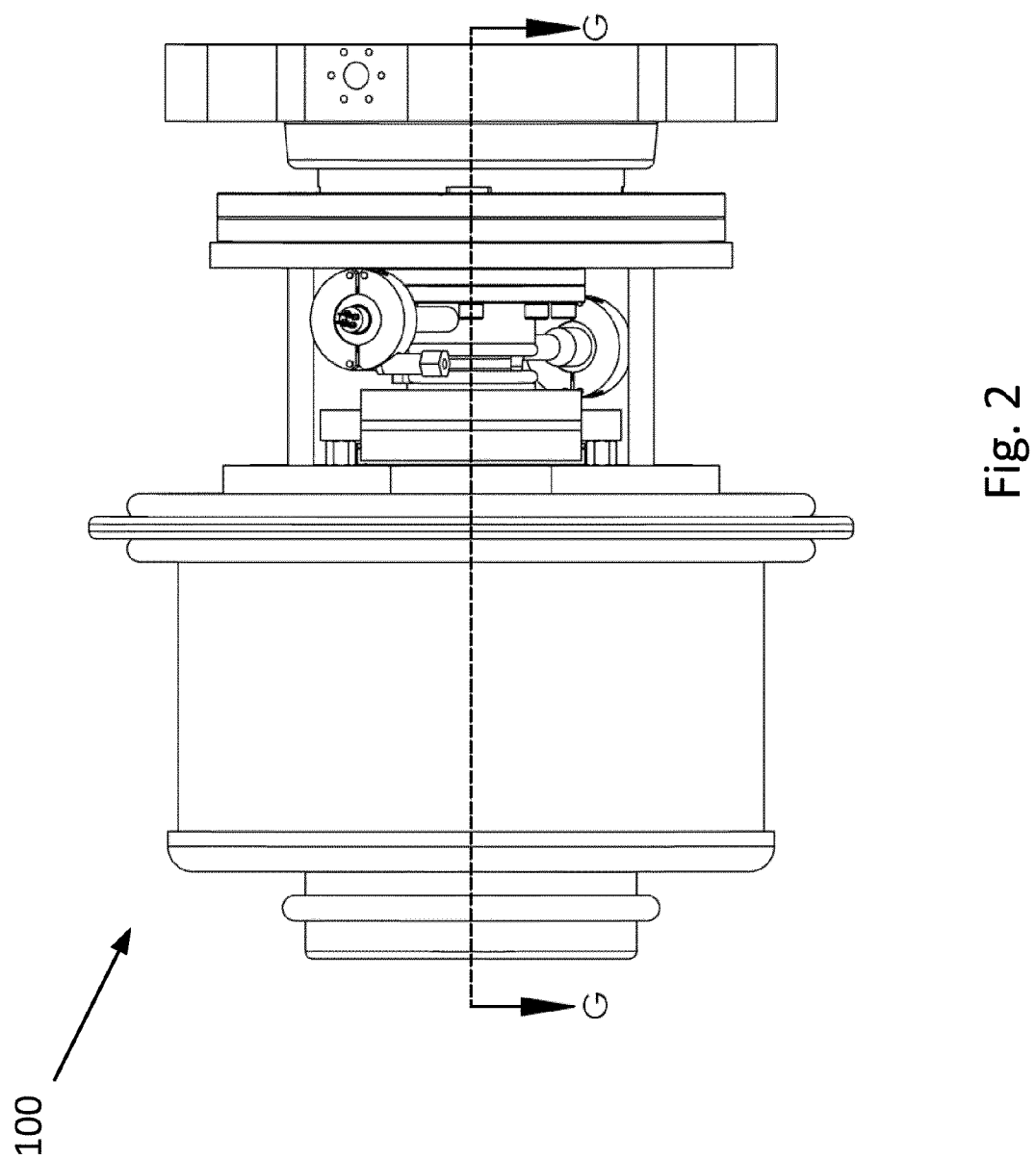
FIG. 2 is schematic top view of the negative ion source of FIG. 1.
Figure 3:
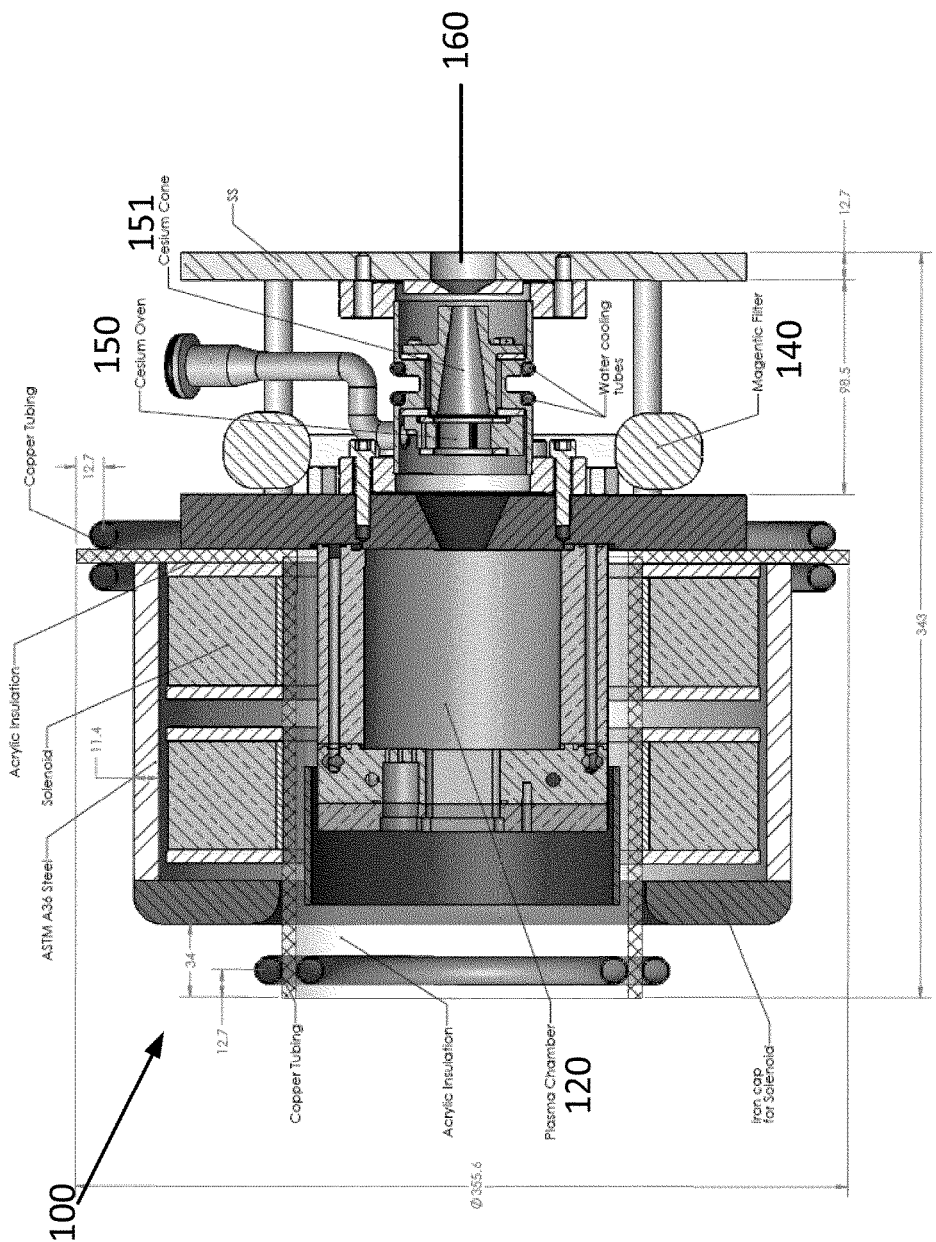
FIG. 3 is a cross-sectional view of the negative ion source of FIG. 1 through the line G-G.
Figure 4:
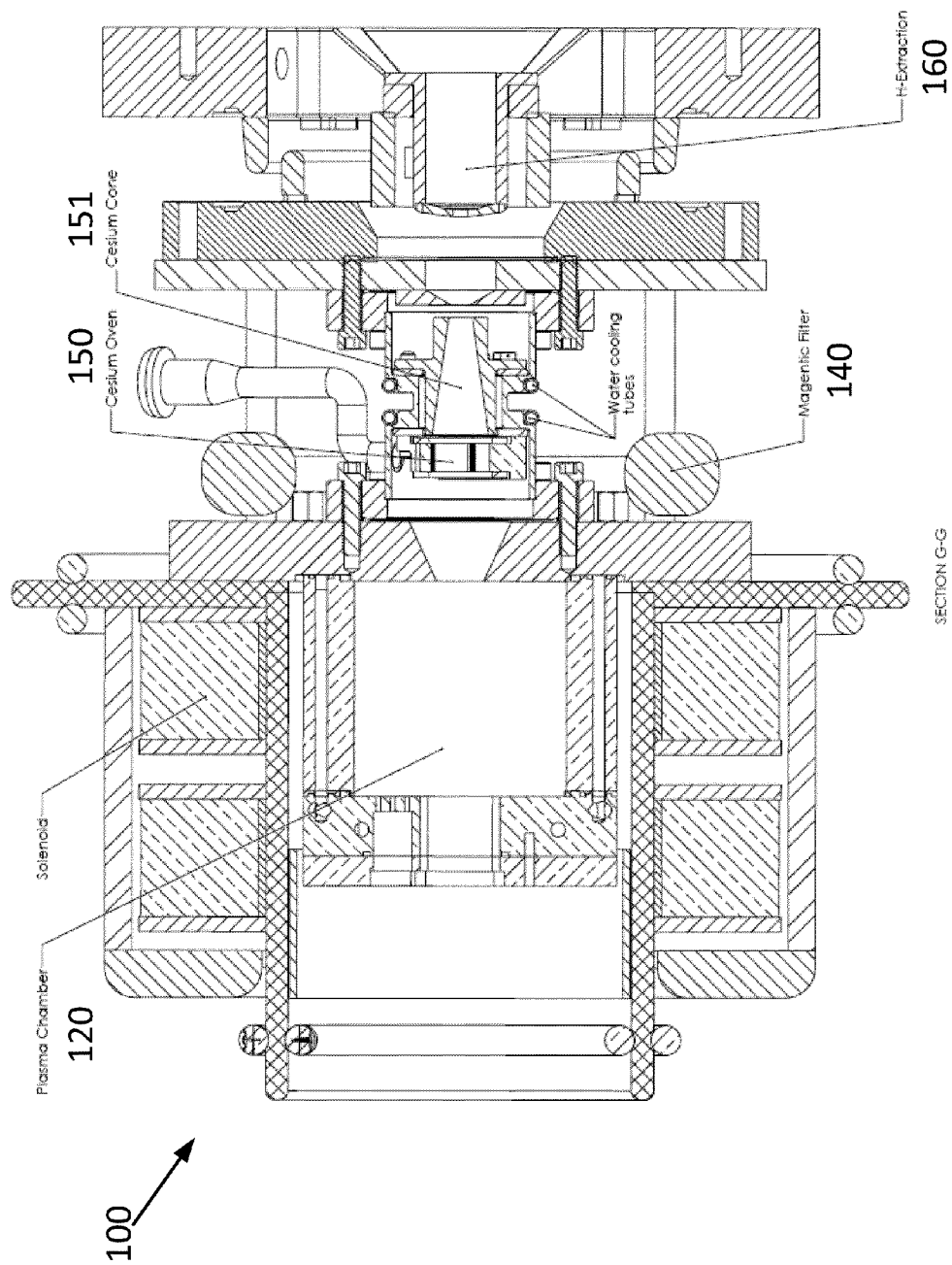
FIG. 4 is a schematic cross-sectional view of the negative ion source of FIG. 1 through the line G-G.

Negative ions are extracted via the negative ion beam formation mechanism 160 (see FIGS. 3 and 4). Negative ion extraction from the negative ion converter 150 takes place in a magnetic field-free region, so electrons follow the negative ion trajectory. One of ordinary skill in the art will expect an e: negative ion ratio >1, so some care has to be taken in dumping the accelerated electron power. The negative ion and electron currents are separated after the beam reaches full energy by imposition of a weak magnetic field. The ion source main body is then offset from the accelerator beam line by the bend angle of the negative ion beam. A suitable water-cooled beam dump is installed at the electron dump location. The PBGUNS simulation code, as described in Jack Boers, Proc. Of the 1995 Particle Accelerator Conference, IEEE Catalog Number 95CH35843, p. 2312; R. F. Welton, et. al., Rev. of Sci. Instrum. 73 (2), 1013 (2002), the entire contents of which are incorporated by reference herein, is used to design, simulate, and verify an optimized negative ion extraction system.

Figure 25:
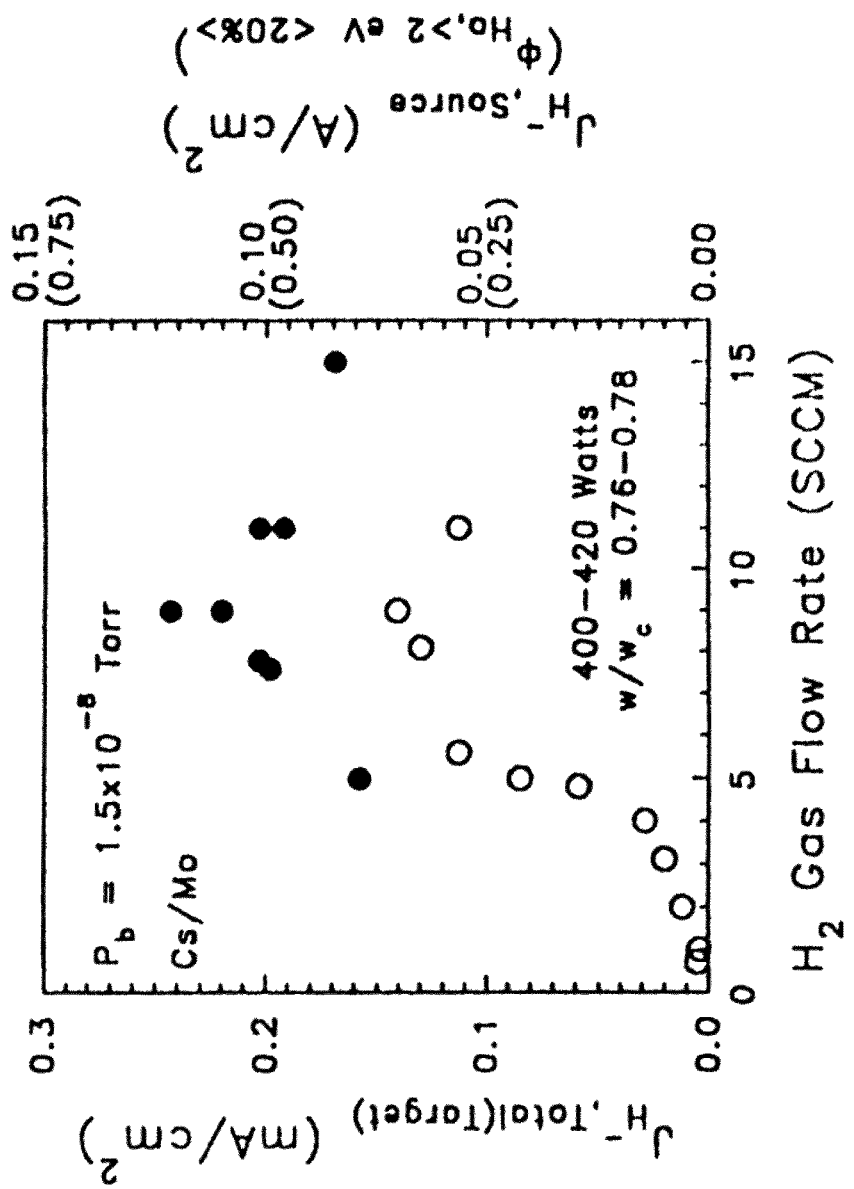
FIG. 25 illustrates 1993 results from Lee. Shown are measured negative current densities as a function of gas flow rate using a Lisitano coil ion source and a Cs converter.
Figure 26:
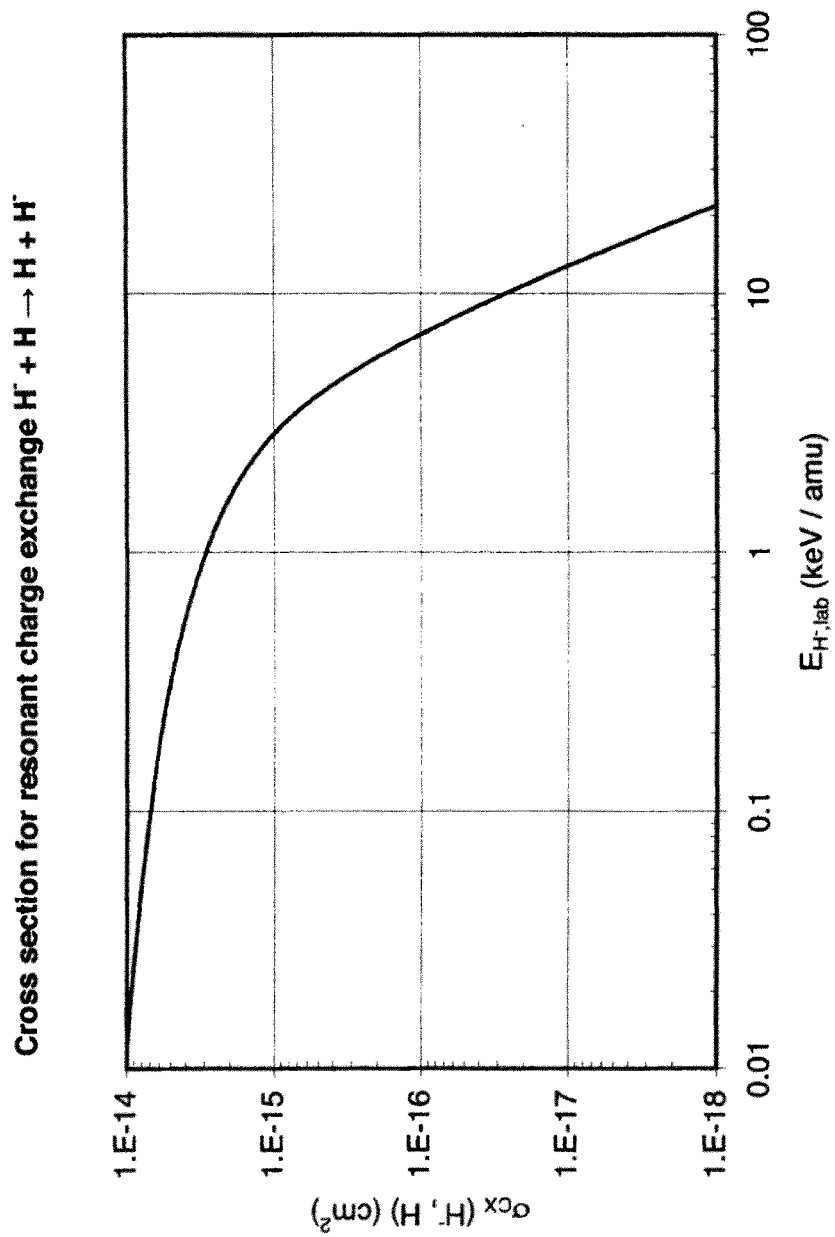
FIG. 26 illustrates resonant charge-exchange cross section for the $H°+H^-$ system.

An emission aperture in the negative ion beam formation mechanism 160 will have to be optimized for negative ion beam production, emittance, and beam brightness requirements summarized in eqns. (1) and (4). Results found at the Stevens Institute (see Brian S. Lee) are shown in FIG. 25. The maximum measured negative ion current density reported was 0.25 mA/cm² with ~420 W of microwave power using the Lisitano coil ion source (see Lee and Brian S. Lee). If a 6.0 cm long cesiated cone surface converter with a neutral atom opening diameter of 4.0 cm narrowing down to a 0.8 cm diameter emission aperture is used, then the converter surface area is 47 cm². The observed 0.25 mA/cm² current density combined with this surface area gives 12 mA of negative ions. Furthermore, the ion source will operate with at least three times greater microwave power —at least 1200 W. Also, the cone-shaped converter 150 surface may recycle the negative ions that do not pass through the emission aperture. This recirculation may be especially effective for the interaction of slow negative ions from the converter with slow neutral atoms from the generator that are directed toward the plasma electrode aperture. This situation will bring into play the large resonant charge exchange of negative ions interacting with neutral atoms, shown in FIG. 26. Another favorable feature of the microwave source is the conversion of all molecular gas to atomic species. Even if a large majority of the neutral atoms escape the plasma chamber below hyperthermal energies, the very large neutral atom flux plus the recirculation of negative ions near the plasma aperture will lead to enhanced negative ion production.

Diagnostic Procedures for Checking Performance of the Neutral Atom Generator

The neutral atom velocity and flux are critical for the subsequent negative ion creation. A rotating disk assembly with slots offset by an angle $f_a$ may be provided as a diagnostic tool to monitor the neutral atom velocity. The rotating disk assemblies will separated by a known distance L. By requiring the neutral atom time of flight between the disks to equal the rotation time for the second slot to rotate to the beam pulse location, one of ordinary skill in the art derives the equation:

$$w = b f_a c / L \qquad (10)$$

where w is rotation velocity in rad/s, b is relativistic velocity of neutral atoms, and c is the velocity of light. Converting this equation to rpm, taking b to be the velocity of 2 eV neutral atoms, L=25 cm, and $f_a=2°$, one finds a rotational velocity of 25,000 rpm. The detector for transmitted neutral atoms may be a negatively biased metal wire, so that the secondary electrons produced by neutral atomic interactions with the metal ribbon would be detected.

Other methods for determining neutral particle velocities have been used. One method, as described in Bernardo Jaduszliwer and Yat C. Chan, "Atomic Velocity Distributions Out of Hydrogen Maser Dissociators", Chemistry and Physics Laboratory, The Aerospace Corp., P.O. Box 92957, Los Angeles, Calif. 90009, the entire contents of which is incorporated herein, uses the magnetic moment of neutral atoms interacting with a non-uniform magnetic field. That work used an RF dissociator of molecules and would be sensitive to hyperthermal neutral atoms. That work led to peak atom energies of about 0.06 eV. The degradation in energy from the ~2 eV expected energy from the molecular dissociation was attributed to inelastic processes. The electrical polarizability of alkalai clusters [12] deflected by two-wire electrical fields and choppers was used to gain velocity information.

Optical spectroscopic methods have been used to study anomalous Doppler broadening of neutral atom lines, as described in Zoran Petrovic and Vladimir Stojanovic, "Anomalous Doppler Broadening of Hydrogen Lines Due to Excitation by Fast Neutrals in Low Pressure Townsend Discharges", Mem. S. A. It. Vol 7, 172 (2005); K Akhtar, John Scharer, and R. I. Mills, "Substantial Doppler Broadening of Atomic Hydrogen Lines in DC and Capacitively Coupled RF Plasmas", J. Phys. D: Appl. Phys. 42, 135207 (2009)., the entire contents of which is incorporated by reference herein. Low cost spectrometers are available which can be used to measure the atomic Balmer lines. Optical spectroscopic methods may be the easiest diagnostic to implement, and they may give the desired information on the hyperthermal vs. thermal neutral atom distribution. Careful consideration will be given to this diagnostic, as it may be the simplest and least expensive diagnostic to install for neutral atom energy and density measurements.

Obtaining neutral atom divergence and beam energy models are discussed in E. C. Samano, W. E. Carr, M. Seidl, and Brian S. Lee, Rev. of Sci. Instrum. 64(10), 2746 (October, 1993), the entire contents of which are incorporated by reference herein. The atomic beam divergence can be deduced by observing the burn pattern of neutral atoms in a $MoO_3$ film. Reduction of neutral atoms changes the $MoO_3$ film (yellow-green) to $MoO_2$ (blue). calorimetric measurements with different calorimeter materials will be used to deduce temperature increases associated with the neutral atom beam. Even for hyperthermal neutral atoms, expected power to the calorimeter may be 1 W or less, so special care will need to be exercised in calorimeter design.

As utilized herein, the terms "approximately," "about," "substantially", and similar terms are intended to have a broad meaning in harmony with the common and accepted usage by those of ordinary skill in the art to which the subject matter of this disclosure pertains. It should be understood by those of skill in the art who review this disclosure that these terms are intended to allow a description of certain features described and claimed without restricting the scope of these features to the precise numerical ranges provided. Accordingly, these terms should be interpreted as indicating that insubstantial or inconsequential modifications or alterations of the subject matter described and claimed are considered to be within the scope of the invention as recited in the appended claims.

It should be noted that the term "exemplary" as used herein to describe various embodiments is intended to indicate that such embodiments are possible examples, representations, and/or illustrations of possible embodiments (and such term is not intended to connote that such embodiments are necessarily extraordinary or superlative examples).

The terms "coupled," "connected," and the like as used herein mean the joining of two members directly or indirectly to one another. Such joining may be stationary (e.g., permanent) or moveable (e.g., removable or releasable). Such joining may be achieved with the two members or the two members and any additional intermediate members being integrally formed as a single unitary body with one another or with the two members or the two members and any additional intermediate members being attached to one another.

References herein to the positions of elements (e.g., "top," "bottom," "above," "below," etc.) are merely used to describe the orientation of various elements in the FIGURES. It should be noted that the orientation of various elements may differ according to other exemplary embodiments, and that such variations are intended to be encompassed by the present disclosure.

It is important to note that the construction and arrangement of the long lifetime, high current, continuous wave (CW) negative ion source shown and/or described in the various exemplary embodiments is illustrative only. Although only a few embodiments have been described in detail in this disclosure, those skilled in the art who review this disclosure will readily appreciate that many modifications are possible (e.g., variations in sizes, dimensions, structures, shapes and proportions of the various elements, values of parameters, mounting arrangements, use of materials, colors, orientations, etc.) without materially departing from the novel teachings and advantages of the subject matter described herein. For example, elements shown as integrally formed may be constructed of multiple parts or elements, the position of elements may be reversed or otherwise varied, and the nature or number of discrete elements or positions may be altered or varied. The order or sequence of any process or method steps may be varied or re-sequenced according to alternative embodiments. Other substitutions, modifications, changes and omissions may also be made in the design, operating conditions and arrangement of the various exemplary embodiments without departing from the scope of the present invention.

What is claimed is:

1. A negative ion source comprising:
   a plasma chamber containing a gas to be ionized;
   a microwave source configured to transmit microwaves to the plasma chamber to ionize the gas into atomic species including hyperthermal neutral atoms;
   a negative ion source converter configured to convert the hyperthermal neutral atoms to negative ions;
   a magnetic filter configured to reduce a temperature of electrons between the plasma chamber and the negative ion source converter;
   a beam formation mechanism configured to extract the negative ions; and
   at least one waveguide configured to electrically isolate the plasma chamber and the microwave source, the at least one waveguide configured to allow a break in the waveguide to be insulated with air.

2. The negative ion source of claim 1, wherein the negative ion source is a continuous wave negative ion source.

3. The negative ion source of claim 1, wherein the plasma chamber has a high voltage and the microwave source is at ground potential.

4. The negative ion source of claim 1, wherein said at least one wave guide comprises a flange configured to allow said break in the waveguide to be insulated with air.

5. The negative ion source of claim 1, wherein the gas to be ionized is hydrogen, the hyperthermal neutral atoms produced are hyperthermal neutral hydrogen atoms, and the negative ions produced are negative hydrogen ions.

6. The negative ion source of claim 1, wherein the microwave source comprises a 2.45 GHz microwave source.

7. The negative ion source of claim 1, wherein the negative ion source converter comprises a cone-shaped cesiated surface.

8. The negative ion source of claim 1, wherein the magnetic filter comprises a tunable magnetic dipole field provided circumferentially around a junction between the plasma chamber and the negative ion converter.

9. The negative ion source of claim 1, wherein the beam formation mechanism extracts the negative ions at a voltage of 30 kV.

10. A negative ion source comprising:
    a plasma chamber containing gas to be ionized;
    a microwave source configured to transmit microwaves to the plasma chamber to ionize the gas into atomic species including hyperthermal neutral atoms;
    a negative ion converter configured to convert the hyperthermal neutral atoms to negative ions;
    a beam formation mechanism configured to extract the negative ions; and
    at least one waveguide configured to electrically isolate the plasma chamber and the microwave source, the at least one waveguide configured to allow a break in the waveguide to be insulated with air.

11. The negative ion source of claim 10, wherein the plasma chamber has a high voltage and the microwave source is at ground potential.

12. The negative ion source of claim 10, wherein said at least one waveguide comprises a flange configured to allow said break in the waveguide to be insulated with air.

13. The negative ion source of claim 10, wherein the microwave source comprises a 2.45 GHz microwave source.

14. The negative ion source of claim 10, wherein the negative ion converter comprises a cone-shaped cesiated surface.

15. The negative ion source of claim 1, wherein the beam formation mechanism extracts the negative ions at a voltage of 30 kV.

16. A method of producing negative ions, the method comprising: providing a gas to be ionized in a plasma chamber; transmitting microwaves from a microwave source to the plasma chamber to ionize the gas such that hyperthermal neutral atoms of the gas are produced; converting the hyperthermal neutral atoms to negative ions via an interaction with a negative ion source converter; extracting the negative ions with a beam formation mechanism; and electrically isolating the plasma chamber and the microwave source with at least one waveguide such that a break in the waveguide to be insulated with air.

17. The method of claim 16, further comprising reducing a temperature of electrons provided between the plasma chamber and the negative ion source converter with a magnetic filter.

18. The method of claim 16, wherein said electrically isolating comprising use of a flange configured to allow said break in the waveguide to be insulated with air.

19. The negative ion source of claim 1, wherein the negative ion source converter comprises a cone-shaped surface.

20. The negative ion source of claim 1, wherein the negative ion source converter comprises a cesiated surface.

* * * * *

UNITED STATES PATENT AND TRADEMARK OFFICE
CERTIFICATE OF CORRECTION

PATENT NO. : 9,847,205 B2  
APPLICATION NO. : 14/903747  
DATED : December 19, 2017  
INVENTOR(S) : Joseph D. Sherman et al.

Page 1 of 1

It is certified that error appears in the above-identified patent and that said Letters Patent is hereby corrected as shown below:

In the Specification

Please insert the following paragraph in Column 1, beginning on Line 12:
--STATEMENT REGARDING FEDERALLY SPONSORED RESEARCH OR DEVELOPMENT
This invention was made with government support under DE-SC-0009642 awarded by the U.S. Department of Energy. The government has certain rights in the invention.--

Signed and Sealed this
Seventeenth Day of September, 2019

Andrei Iancu
*Director of the United States Patent and Trademark Office*